US012218216B2

(12) United States Patent
Lu et al.

(10) Patent No.: US 12,218,216 B2
(45) Date of Patent: Feb. 4, 2025

(54) METHOD FOR MANUFACTURING SEMICONDUCTOR DEVICES HAVING GATE SPACERS WITH BOTTOM PORTIONS RECESSED IN A FIN

(71) Applicant: Taiwan Semiconductor Manufacturing Company, Ltd., Hsinchu (TW)

(72) Inventors: Wei-Liang Lu, Hsinchu (TW); Chang-Yin Chen, Taipei (TW); Chih-Han Lin, Hsinchu (TW); Chia-Yang Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/232,191

(22) Filed: Aug. 9, 2023

(65) Prior Publication Data

US 2023/0387245 A1 Nov. 30, 2023

Related U.S. Application Data

(62) Division of application No. 17/244,430, filed on Apr. 29, 2021.

(Continued)

(51) Int. Cl.
*H01L 29/66* (2006.01)
*H01L 21/8234* (2006.01)
(Continued)

(52) U.S. Cl.
CPC .. *H01L 29/4983* (2013.01); *H01L 21/823431* (2013.01); *H01L 21/823468* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

CN 105027291 A 11/2015
CN 107689396 A 2/2018
(Continued)

*Primary Examiner* — Younes Boulghassoul
(74) *Attorney, Agent, or Firm* — Sterne, Kessler, Goldstein & Fox P.L.L.C.

(57) ABSTRACT

A semiconductor device and methods of fabricating the same are disclosed. The semiconductor device includes a substrate, a fin structure with a fin top surface disposed on the substrate, a source/drain (S/D) region disposed on the fin structure, a gate structure disposed on the fin top surface, and a gate spacer with first and second spacer portions disposed between the gate structure and the S/D region. The first spacer portion extends above the fin top surface and is disposed along a sidewall of the gate structure. The second spacer portion extends below the fin top surface and is disposed along a sidewall of the S/D region.

20 Claims, 22 Drawing Sheets

Related U.S. Application Data

(60) Provisional application No. 63/055,240, filed on Jul. 22, 2020.

(51) Int. Cl.
    *H01L 21/8238*     (2006.01)
    *H01L 27/088*     (2006.01)
    *H01L 29/08*     (2006.01)
    *H01L 29/49*     (2006.01)
    *H01L 29/78*     (2006.01)

(52) U.S. Cl.
    CPC ............ *H01L 21/823821* (2013.01); *H01L 21/823864* (2013.01); *H01L 27/0886* (2013.01); *H01L 29/0847* (2013.01); *H01L 29/6653* (2013.01); *H01L 29/66545* (2013.01); *H01L 29/6656* (2013.01); *H01L 29/66636* (2013.01); *H01L 29/66795* (2013.01); *H01L 29/785* (2013.01); *H01L 29/7851* (2013.01)

(58) Field of Classification Search
    CPC ........... H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823468; H01L 21/823864; H01L 29/6656; H01L 29/6653; H01L 29/66553; H01L 29/4983; H01L 29/0653; H01L 21/823418; H01L 21/823814; H01L 21/823425; H01L 29/0847; H01L 29/7848; H01L 29/66636; H01L 29/41783; H01L 29/66575; H10B 12/36; H10B 12/056

See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,343,575 | B1 | 5/2016 | Lee et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,786,783 | B2 | 10/2017 | Hafez et al. |
| 10,115,808 | B2 | 10/2018 | Lin et al. |
| 10,707,328 | B2 | 7/2020 | Sung et al. |
| 10,868,138 | B2 | 12/2020 | Chang et al. |
| 10,879,355 | B2 | 12/2020 | Li et al. |
| 2014/0273397 | A1 | 9/2014 | Rodder et al. |
| 2014/0291737 | A1* | 10/2014 | Hafez ............ H01L 29/78 257/288 |
| 2015/0263172 | A1 | 9/2015 | Cho et al. |
| 2016/0064225 | A1 | 3/2016 | Kim et al. |
| 2016/0149040 | A1* | 5/2016 | Lee ............ H01L 29/7851 257/408 |
| 2018/0040715 | A1 | 2/2018 | Chang et al. |
| 2020/0105619 | A1* | 4/2020 | Lin ............ H01L 29/66636 |
| 2020/0105875 | A1* | 4/2020 | Li ............ H01L 21/3083 |
| 2020/0176591 | A1* | 6/2020 | Wong ............ H01L 29/66795 |
| 2022/0028997 | A1 | 1/2022 | Lu et al. |

FOREIGN PATENT DOCUMENTS

| | | |
|---|---|---|
| CN | 110957272 A | 4/2020 |
| TW | 201820633 A | 6/2018 |
| TW | 201822292 A | 6/2018 |

\* cited by examiner

METHOD FOR MANUFACTURING SEMICONDUCTOR DEVICES HAVING GATE SPACERS WITH BOTTOM PORTIONS RECESSED IN A FIN

CROSS-REFERENCE TO RELATED APPLICATIONS

This application is a divisional of U.S. patent application Ser. No. 17/244,430, titled "Gate Spacers in Semiconductor Devices," filed Apr. 29, 2021, which claims the benefit of U.S. Provisional Patent Application No. 63/055,240, titled "Device Improvement by Advance Gate Etching Process," filed Jul. 22, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
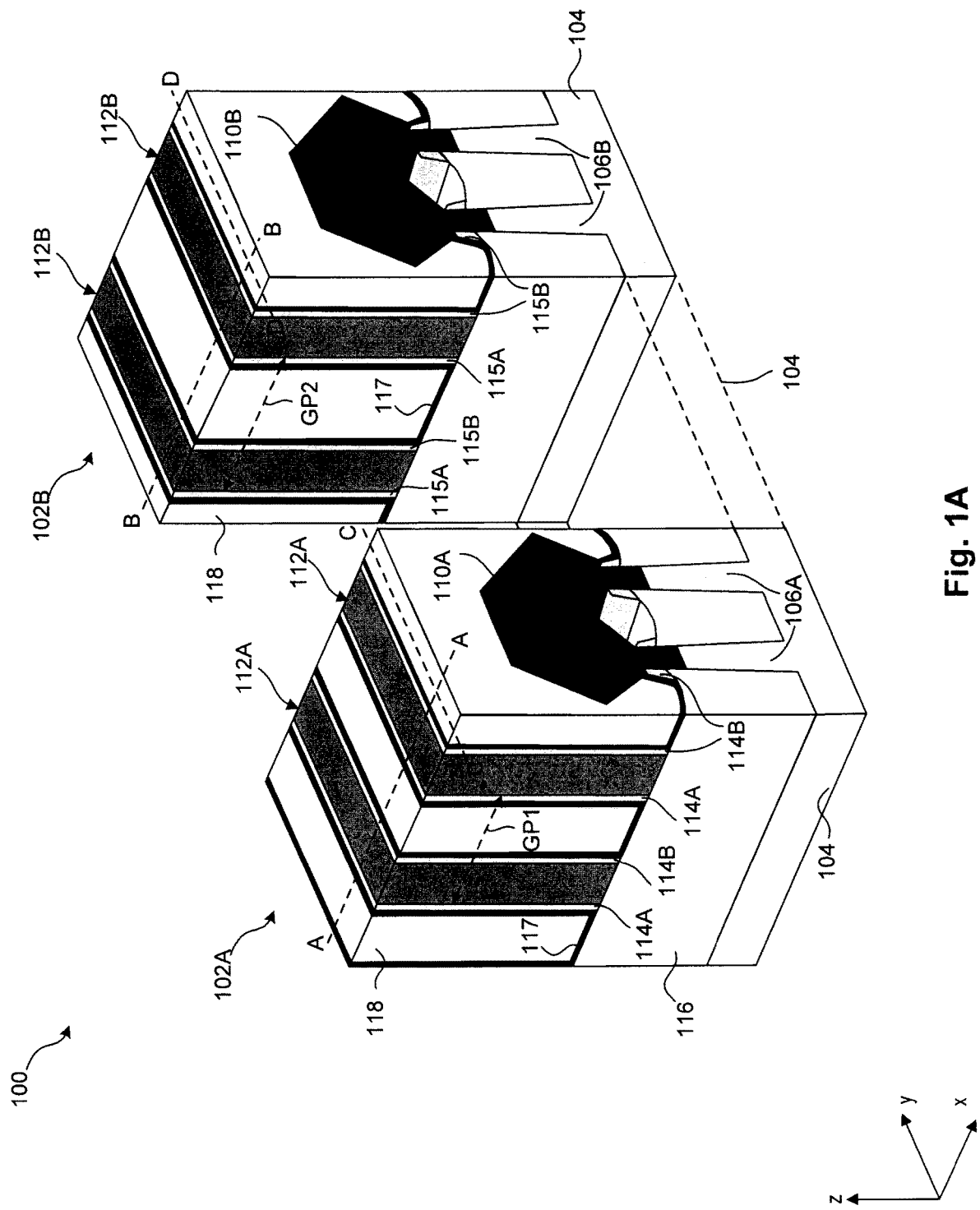
FIG. 1A illustrates an isometric view of a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., finFETs) with extended gate spacers in gate structures and example methods of forming such semiconductor devices. The extended gate spacers improve sidewall profiles of epitaxial source/drain (S/D) regions and prevent the epitaxial S/D regions from extending into the gate structure regions during fabrication to avoid electrical shorting between the epitaxial S/D regions and gate structures.

In some embodiments, the gate structures are disposed on a fin structure of the semiconductor device and the epitaxial S/D regions are grown within an etched region of the fin structure. The gate structures are separated from the epitaxial S/D regions by the extended gate spacers disposed along sidewalls of the gate structures. In some embodiments, first spacer portions of the extended gate spacers are disposed on a fin top surface of the fin structure and second spacer portions of the extended gate spacers are disposed within the fin structure. The first spacer portions can have non-tapered structures and the second spacer portions can have tapered structures. The first spacer portions can protect the gate structures during subsequent processing of adjacent structures. The second spacer portions can control the etch profiles of S/D openings formed in the fin structure for the growth of the epitaxial S/D regions in the S/D openings. As a result, the second spacer portions control the sidewall profiles of the epitaxial S/D regions grown in the S/D openings and prevent the epitaxial S/D regions from extending into the gate structure regions.

Figure 1B:
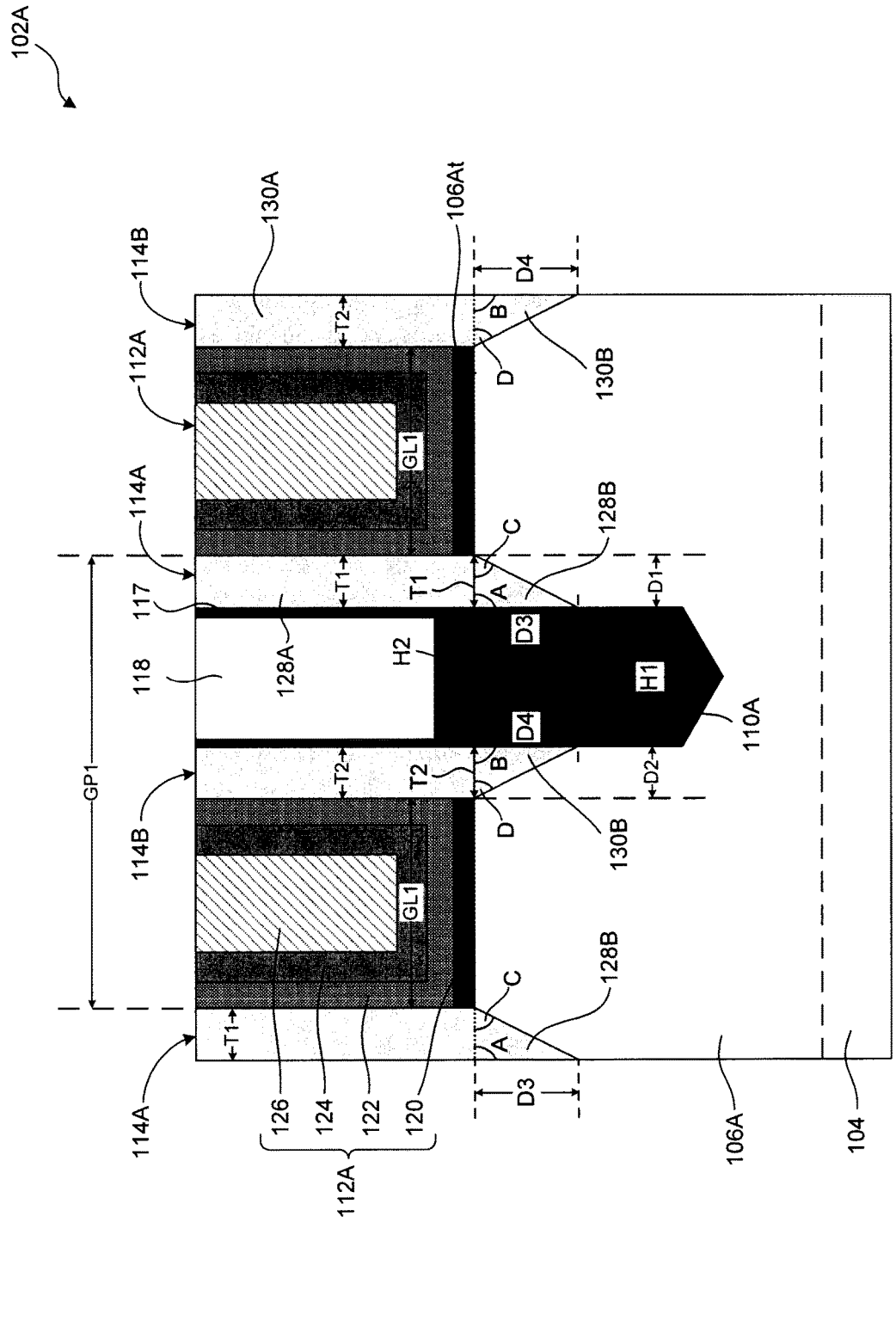
FIGS. 1B-1D illustrate cross-sectional views of a semiconductor device with extended gate spacers, in accordance with some embodiments.
Figure 1C:
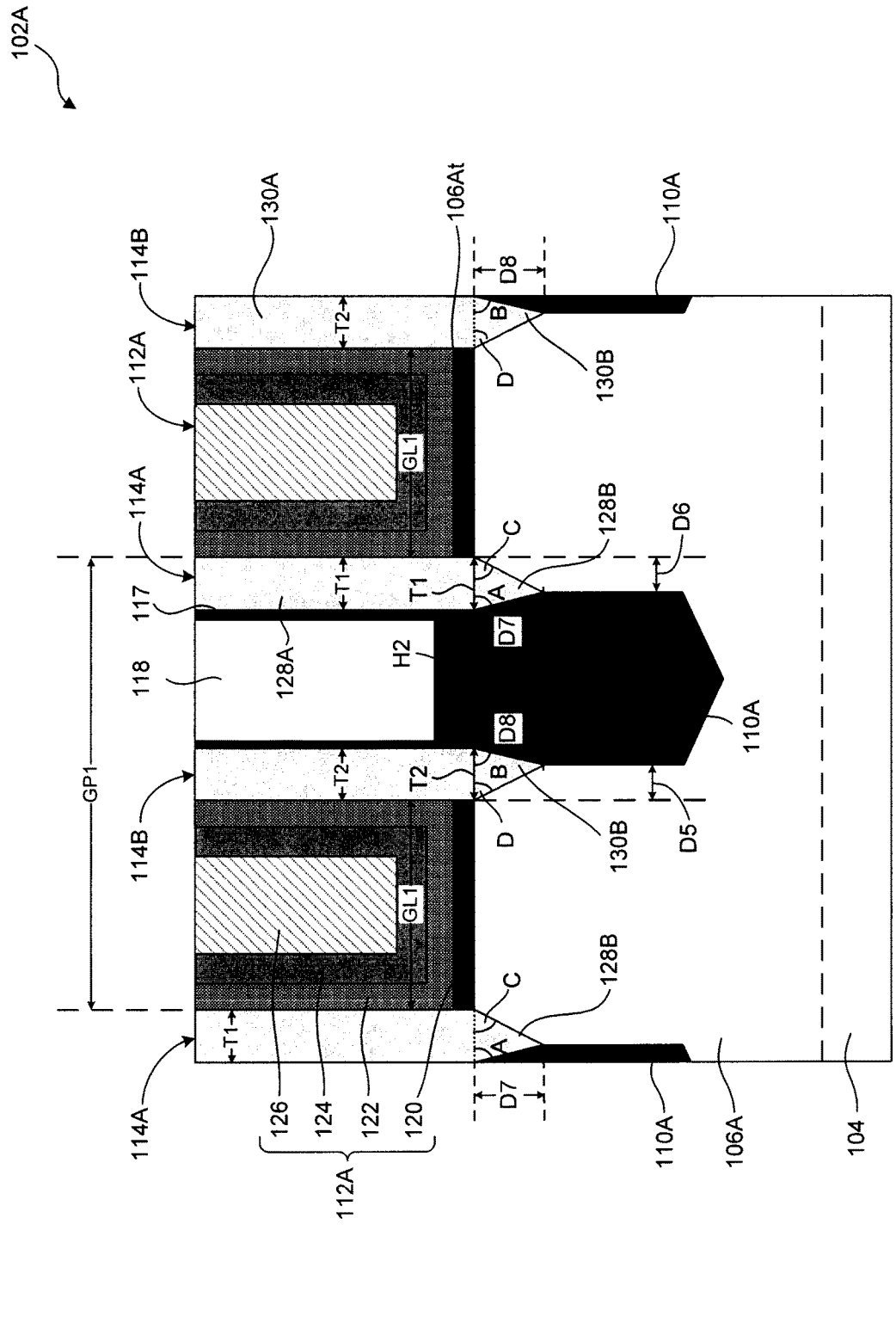
Figure 1D:
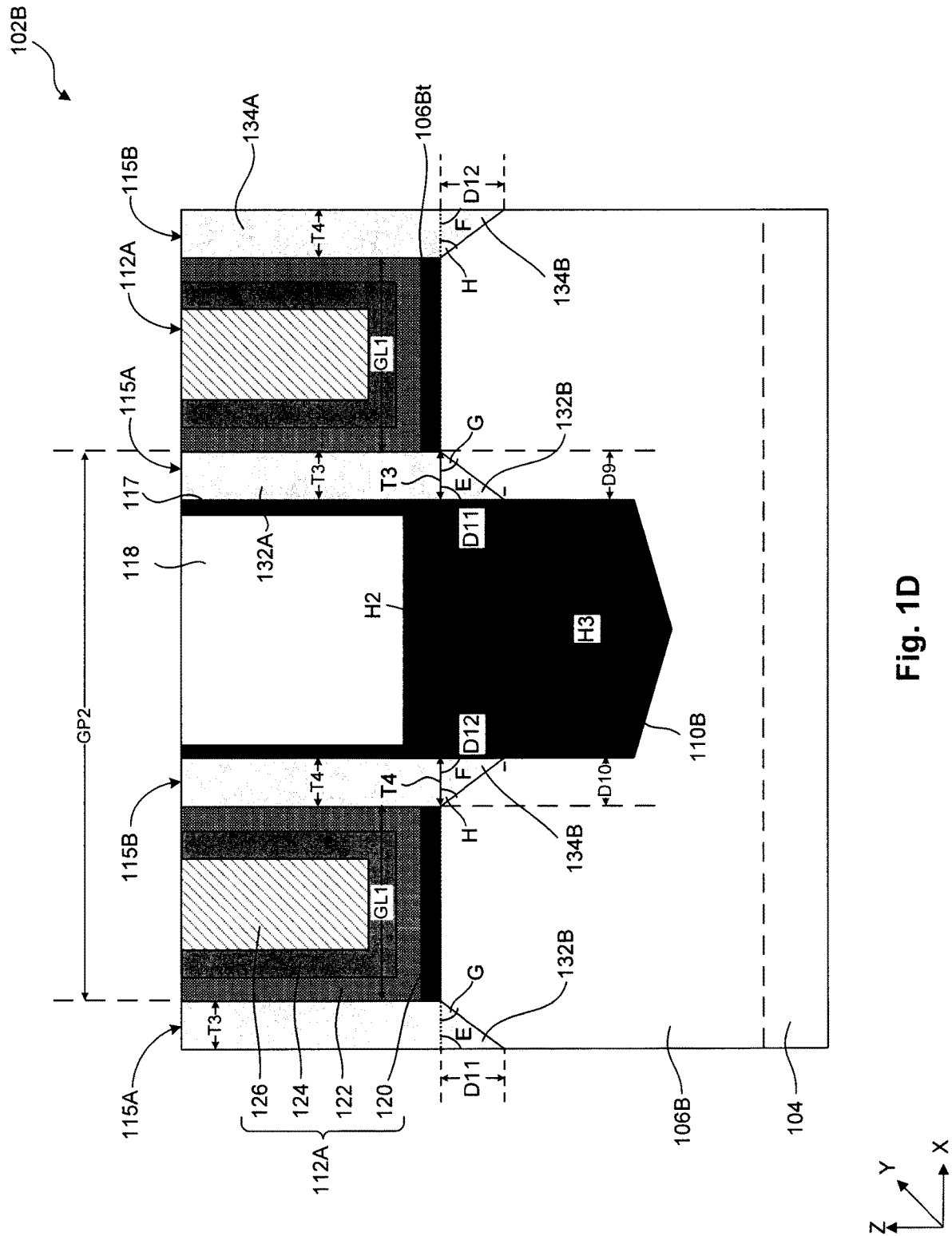

FIG. 1A illustrates an isometric view of a semiconductor device 100 with FETs 102A and 102B, according to some embodiments. In some embodiments, FETs 102A and 102B can represent n-type FETs 102A and 102B (NFETs 102A and 102B) or p-type FETs 102A and 102B (PFETs 102A and 102B). The discussion of FETs 102A and 102B applies to both NFETs 102A and 102B, and PFETs 102A and 102B, unless mentioned otherwise. FIGS. 1B and 1C illustrate cross-sectional views of FET 102A along line A-A of FIG. 1A. FIG. 1D illustrates cross-sectional view of FET 102B along line B-B of FIG. 1A. FIGS. 1B-1D illustrate cross-sectional views of semiconductor device 100 with additional structures that are not shown in FIG. 1A for simplicity. The discussion of elements of FETs 102A and 102B with the same annotations applies to each other, unless mentioned otherwise.

Referring to FIG. 1A, FETs 102A and 102B can include an array of gate structures 112A and 112B disposed on respective fin structures 106A and 106B, and an array of epitaxial S/D regions 110A and 110B disposed on portions of respective fin structures 106A and 106B that are not covered by respective gate structures 112A and 112B. FETs 102A and 102B can further include gate spacers 114A-114B and 115A-115B (also referred to as extended gate spacers 114A-114B and 115A-115B), shallow trench isolation (STI) regions 116, etch stop layers (ESLs) 117, and interlayer dielectric (ILD) layers 118. ILD layers 118 can be disposed on ESLs 117. In some embodiments, gate spacers 114A-114B and 115A-115B, STI regions 116, ESLs 117, and ILD layers 118 can include an insulating material, such as silicon oxide, silicon nitride (SiN), silicon carbon nitride (SiCN), silicon oxycarbon nitride (SiOCN), and silicon germanium oxide.

FETs 102A and 102B can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106A-106B can include a material similar to substrate 104 and extend along an X-axis. In some embodiments, fin structures 106A and 106B can have similar dimensions.

Referring to FIG. 1B, FET 102A can include gate structures 112A disposed on fin top surface 106At, epitaxial S/D regions 110A (one of epitaxial S/D regions 110A visible in FIG. 1B) disposed within fin structure 106A, and gate spacers 114A and 114B. Gate structures 112A can be multi-layered structures and can have a gate pitch GP1. The gate pitch is defined as a sum of a distance along an X-axis between adjacent gate structures (e.g., gate structures 112A) with equal gate lengths (e.g., gate lengths GL1) and a gate length of one of the adjacent gate structures. Each of gate structures 112A can include an interfacial oxide (IO) layer 120, a high-k (HK) gate dielectric layer 122 disposed on IO layer 120, a work function metal (WFM) layer 124 disposed on HK gate dielectric layer 122, and a gate metal fill layer 126 disposed on WFM layer 124.

IO layers 120 can include silicon oxide ($SiO_2$), silicon germanium oxide ($SiGeO_x$), or germanium oxide ($GeO_x$). HK gate dielectric layers 122 can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) other suitable high-k dielectric materials, or (iv) a combination thereof. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

For NFET 102A, WFM layers 124 can include a metallic material with a work function value closer to a conduction band energy than a valence band energy of a material of fin structure 106A. For example, WFM layers 124 can include an Al-based or Al-doped metallic material with a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based fin structure 106A. In some embodiments, WFM layers 124 can include titanium aluminum (TiAl), titanium aluminum carbide (TiAlC), tantalum aluminum (TaAl), tantalum aluminum carbide (TaAlC), Al-doped titanium (Ti), Al-doped titanium nitride (TiN), Al-doped tantalum (Ta), Al-doped tantalum nitride (TaN), other suitable Al-based materials, or a combination thereof.

For PFET 102A, WFM layers 124 can include a metallic material with a work function value closer to a valence band-edge energy than a conduction band-edge energy of a material of fin structure 106A. For example, WFM layers 124 can include a substantially Al-free (e.g., with no Al) metallic material with a work function value equal to or greater than 4.5 eV (e.g., about 4.5 eV to about 5.5 eV), which can be closer to the valence band-edge energy (e.g., 5.2 eV of Si or 4.8 eV of SiGe) than the conduction band-edge energy (e.g., 4.1 eV of Si or 3.8 eV of SiGe) of Si-based or SiGe-based fin structure 106A. In some embodiments, WFM layers 124 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof.

Gate metal fill layers 126 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. In some embodiments, gate metal fill layers 126 can include a substantially fluorine-free metal layer (e.g., fluorine-free W). The substantially fluorine-free metal layer can include an amount of fluorine contaminants less than about 5 atomic percent in the form of ions, atoms, and/or molecules. In some embodiments, gate structures 112A can be electrically isolated from overlying interconnect structures (not shown) by gate capping layers (not shown), which can include dielectric nitride layers.

For NFET 102A, epitaxial S/D region 110A can include an epitaxially-grown semiconductor material, such as Si, and n-type dopants, such as phosphorus and other suitable n-type dopants. For PFET 102A, epitaxial S/D regions 110A can include an epitaxially-grown semiconductor material, such as Si and SiGe, and p-type dopants, such as boron and other suitable p-type dopants.

In some embodiments, gate spacers 114A and 114B can include first spacer portions 128A and 130A, and second spacer portions 128B and 130B. First spacer portions 128A and 130A protect gate structures 112A during subsequent processing of adjacent structures, such as ESLs 117, ILD layers 118, and S/D contact structures (not shown) on epitaxial S/D regions 110A. Second spacer portions 128B and 130B control the etch profiles of S/D openings 1042 (one of S/D openings 1042 shown in FIG. 10A) formed in fin structure 106A for the subsequent growth of epitaxial S/D regions 110A in S/D openings 1042, which is described in detail below. As a result, second spacer portions 128B and 130B control the sidewall profiles of epitaxial S/D regions 110A and prevent epitaxial S/D regions 110A from extending into regions of fin structure 106A under gate structures 112A. As shown in FIG. 1B, epitaxial S/D region 110A has substantially vertical sidewalls along a Z-axis and is separated from gate structures 112A by distances D1 and D2 as a result of second spacer portions 128B and 130B. Distances D1 and D2 can be distances between adjacent sidewalls of gate structure 112A and of portions of epitaxial S/D regions 110A extending below second spacer portions 128B and 130B. In some embodiments, distances D1 and D2 can be equal to or different from each other and can range from about 1 nm to about 15 nm. If distances D1 and D2 are below about 1 nm, there may be diffusion of dopants and/or other materials from epitaxial S/D region 110A into gate structure 112A, which may degrade device performance. On the other hand, if distances D1 and D2 are above 15 nm, the device size and manufacturing cost increases.

First spacer portions 128A and 130A extend above fin top surface 106At and can have non-tapered structures. First spacer portions 128A and 130A can have respective thicknesses T1 and T2, which can be equal to or different from each other and can range from about 1 nm to about 10 nm to adequately protect gate structures 112A without compromising device size and manufacturing cost. In some embodiments, distances D1 and D2 can be equal to or different from respective thicknesses T1 and T2.

Second spacer portions 128B and 130B extend below fin top surface 106At by respective distances D3 and D4, which can be equal to or different from each other. Second spacer portions 128B and 130B can have tapered structures with first and second sidewalls facing each other. The first sidewalls of second spacer portions 128B and 130B are adjacent to epitaxial S/D region 110A and form angles A and B with fin top surface 106At. The second sidewalls of second spacer portions 128B and 130B are adjacent to fin structure 106A and form angles C and D with fin top surface 106At. Angles A and B are also formed between the sidewalls of epitaxial S/D regions 110A and fin top surface 106At.

To adequately control the sidewall profiles of epitaxial S/D regions 110A without compromising device size and manufacturing cost, distances D3 and D4 range from about 1 nm to about 10 nm, and angles A and B range from about 15 degrees to about 90 degrees. In addition, to adequately control the sidewall profiles of epitaxial S/D regions 110A, the values of thicknesses T1 and T2, distances D3 and D4, and angles A and B can be constrained by the following conditions: (i) the difference between thicknesses T1 and T2 is between about 10 nm and about −10 nm, (ii) the difference between distances D3 and D4 is between about 10 nm and about −10 nm, (iii) the difference between thickness T1 and distance D3 is between about 10 nm and about −10 nm, (iv) the difference between thickness T2 and distance D4 is between about 10 nm and about −10 nm, and (v) the difference between angles A and B is equal to zero degrees or between about 0 degrees and about 60 degrees.

In some embodiments, angles C and D are smaller than respective angles A and B and can range from about 30 degrees to about 60 degrees. In some embodiments, the ratio between angles A and C and between angles B and D can be about 2:1. In some embodiments, epitaxial S/D regions 110A extend below second spacer portions 128B and 130B by a distance H1 along a Z-axis and extend above second spacer portions 128B and 130B by a distance H2 along a Z-axis. In some embodiments, distance H1 is greater than distances H2, D3, and D4 and distance H2 is shorter than distances D3 and D4.

In some embodiments, if angles A and B are less than about 90 degrees (e.g., angles A and B are between about 60 degrees and about 90 degrees), second spacer portions 128B and 130B and epitaxial S/D regions 110A can have cross-sectional structures as shown in FIG. 1C, instead of those shown in FIG. 1B. In this situation, second spacer portions 128B and 130B extend below fin top surface 106At by distances D7 and D8, which are shorter than distances D3 and D4. In addition, distances between adjacent sidewalls of gate structure 112A and of portions of epitaxial S/D region 110A extending below second spacer portions 128B and 130B are distances D5 and D6, which are shorter than distances D1 and D2, and thicknesses T1 and T2. These portions of epitaxial S/D region 110A extending below second spacer portions 128B and 130B can have substantially vertical sidewalls along a Z-axis as a result of etch profile control by second spacer portions 128B and 130B during the formation of S/D openings 1042 (described with reference to FIG. 10A). On the other hand, the portions of epitaxial S/D regions 110A adjacent to second spacer portions 128B and 130B can have sloped sidewalls with angles A and B formed between the sloped sidewalls of epitaxial S/D regions 110A and fin top surface 106At.

Similar to distances D3 and D4, the values of distances D7 and D8 can be constrained by the following conditions: (i) the difference between distances D7 and D8 is between about 10 nm and about −10 nm, (ii) the difference between thickness T1 and distance D7 is between about 10 nm and about −10 nm, and (iii) the difference between thickness T2 and distance D8 is between about 10 nm and about −10 nm.

Referring to FIG. 1D, FET 102B can include gate structures 112B disposed on fin top surface 106Bt, epitaxial S/D regions 110B (one of epitaxial S/D regions 110A visible in FIG. 1D) disposed within fin structure 106B, and gate spacers 115A and 115B. The discussion of gate structures 112A and epitaxial S/D regions 110A applies to gate structures 112B and epitaxial S/D regions 110B, unless mentioned otherwise. Each of gate structures 112B can include an TO layer 120, HK gate dielectric layer 122 disposed on IO layer 120, WFM layer 124 disposed on HK gate dielectric layer 122, and gate metal fill layer 126 disposed on WFM layer 124. Gate structures 112B can have gate lengths GL1 similar to gate structures 112A and can have a gate pitch GP2, which is about 2 times to about 5 times greater than GP1 of gate structures 112A. Though FETs 102A and 102B can be formed at the same time on substrate 104 using similar operations (described below with reference to FIG. 2), the dimensions of epitaxial S/D regions 110B and gate spacers 115A and 115B can be different from the dimensions of epitaxial S/D regions 110A and gate spacers 114A and 114B due to the different spacings between gate structures 112A and between gate structures 112B as a result of different gate pitches GP1 and GP2. Due to the larger gate pitch GP2, epitaxial S/D regions 110B can be wider than epitaxial S/D regions 110A along an X-axis.

Similar to gate spacers 114A and 114B, gate spacers 115A and 115B includes first spacer portions 132A and 134A, and second spacer portions 132B and 134B. First spacer portions 132A and 134A protect gate structures 112B during subsequent processing of adjacent structures, such as ESLs 117, ILD layers 118, and S/D contact structures (not shown) on epitaxial S/D regions 110B. Second spacer portions 132B and 134B control the etch profiles of S/D openings (not shown) formed in fin structure 106B for the subsequent growth of epitaxial S/D regions 110B in the S/D openings. As a result, second spacer portions 132B and 134B control the sidewall profiles of epitaxial S/D regions 110B and prevent epitaxial S/D regions 110B from extending into regions of fin structure 106B under gate structures 112B. As shown in FIG. 1D, epitaxial S/D region 110B has substantially vertical sidewalls along a Z-axis and is separated from gate structures 112B by distances D9 and D10 as a result of second spacer portions 132B and 134B. Distances D9 and D10 can be distances between adjacent sidewalls of gate structure 112B and of portions of epitaxial S/D regions 110B extending below second spacer portions 132B and 134B. In some embodiments, distances D9 and D10 can be equal to or different from each other and can range from about 1 nm to about 15 nm, similar to distances D1 and D2 of FET 102A.

First spacer portions 132A and 134A extend above fin top surface 106Bt and can have non-tapered structures. First spacer portions 132A and 134A can have respective thicknesses T3 and T4, which can be equal to or different from each other and can range from about 1 nm to about 10 nm to adequately protect gate structures 112B without compromising device size and manufacturing cost. In some embodiments, distances D9 and D10 can be equal to or different from respective thicknesses T3 and T4. In some embodiments, thicknesses T3 and T4 can be greater than respective thicknesses T1 and T2 of first spacer portions 128A and 130A because a thicker spacer material can be deposited within the wider spacing between gate structures 112B than that deposited within the narrower spacing between gate structures 112A during the simultaneous formation of gate spacers 114A-114B and 115A-115B.

Second spacer portions 132B and 134B extend below fin top surface 106Bt by respective distances D11 and D12, which can be equal to or different from each other. In some embodiments, distances D11 and D12 can be shorter than respective distances D3 and D4 of second spacer portions 128A and 130A. This difference in distances can be due to the difference in the radii of curvatures of spacer openings 740 and 1340 (described with reference to FIGS. 7A and 13, respectively) in which gate spacers 114A-114B and 115A-115B are formed. Spacer opening 1340 formed by etching fin structure 106B between gate structures 112B can have a smaller radius of curvature compared to the spacer opening 740 formed in the same operation at the same time by etching fin structure 106A between gate structures 112A. As a result of the smaller radius of curvature of spacer opening 1340, second spacer portions 132B and 134B extend shorter distances D11 and D12 into fin structure 106B compared to distances D3 and D4 of second spacer portions 128B and 130B. The difference in the radii of curvatures of spacer openings 740 and 1340 can be due to the inverse relationship between the width of an etched region and the radius of curvature of the etched region. Since spacer opening 1340 between gate structures 112B is wider than spacer opening 740 between gate structures 112A, spacer opening 1340 has a radius of curvature smaller than that of spacer opening 740.

Similar to second spacer portions 128B and 130B, second spacer portions 132B and 134B can have tapered structures with first and second sidewalls facing each other. The first sidewalls of second spacer portions 132B and 134B are adjacent to epitaxial S/D region 110B and form angles E and F with fin top surface 106Bt. The second sidewalls of second spacer portions 132B and 134B are adjacent to fin structure 106B and form angles G and H with fin top surface 106Bt. Angles E and F are also formed between the sidewalls of epitaxial S/D regions 110B and fin top surface 106Bt.

To adequately control the sidewall profiles of epitaxial S/D regions 110B without compromising device size and manufacturing cost, distances D11 and D12 range from about 1 nm to about 10 nm, and angles E and F can range from about 15 degrees to about 90 degrees. Similar to second spacer portions 128B and 130B, the values of thicknesses T3 and T4, distances D11 and D12, and angles E and F can be constrained by the following conditions: (i) the difference between thicknesses T3 and T4 is between about 10 nm and about −10 nm, (ii) the difference between distances D11 and D12 is between about 10 nm and about −10 nm, (iii) the difference between thickness T3 and distance D11 is between about 10 nm and about −10 nm, (iv) the difference between thickness T4 and distance D12 is between about 10 nm and about −10 nm, and (v) the difference between angles E and F is equal to zero degrees or between about 0 degrees and about 60 degrees. In addition, the values of thicknesses T1 and T4, and distances D3 and D4 and D11 and D12, can be constrained by conditions: (i) the difference between the difference of thicknesses T3 and T4 and the difference of thicknesses T1 and T2 is between about 10 nm and about −10 nm, and (ii) the difference between the difference of distances D11 and D12 and the difference of distances D3 and D4 is between about 10 nm and about −10 nm.

In some embodiments, angles G and H are smaller than respective angles E and F and can range from about 30 degrees to about 60 degrees. In some embodiments, the ratio between angles E and G and between angles F and H can be about 2:1.

Figure 2:
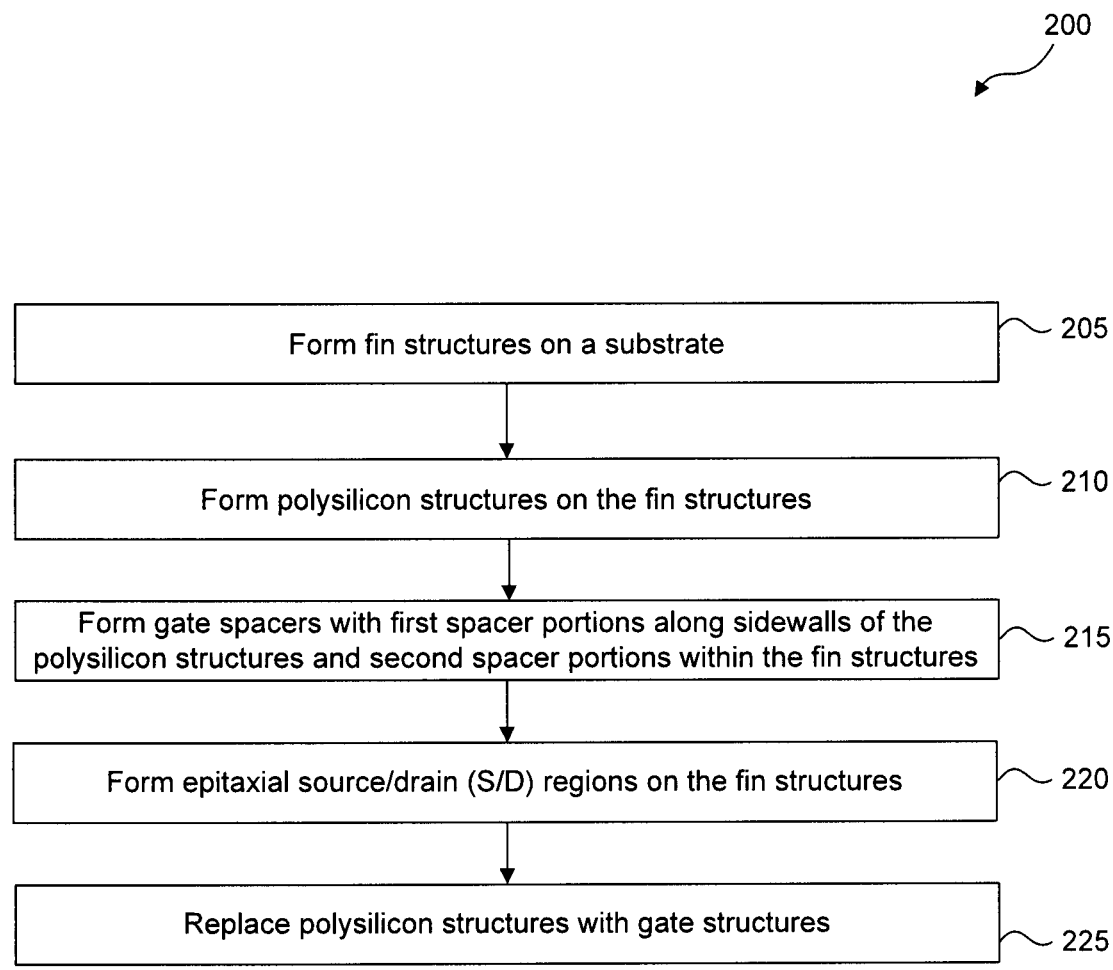
FIG. 2 is a flow diagram of a method for fabricating a semiconductor device with extended gate spacers, in accordance with some embodiments.
Figure 4:
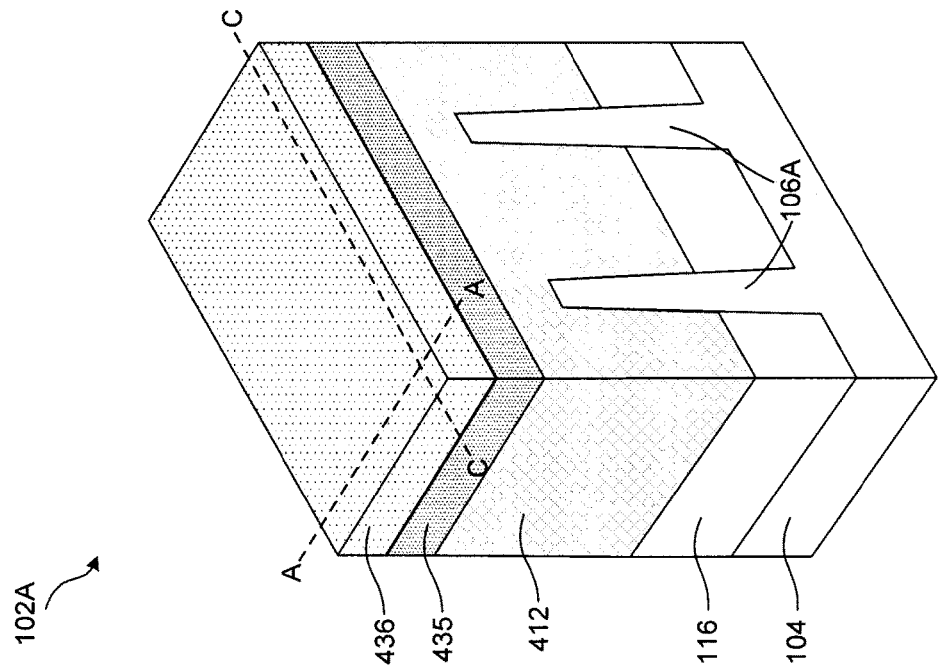
FIGS. 3-4, 5A-12B, and 13-14 illustrate isometric and cross-sectional views of a semiconductor device with extended gate spacers at various stages of its fabrication process, in accordance with some embodiments.
Figure 3:
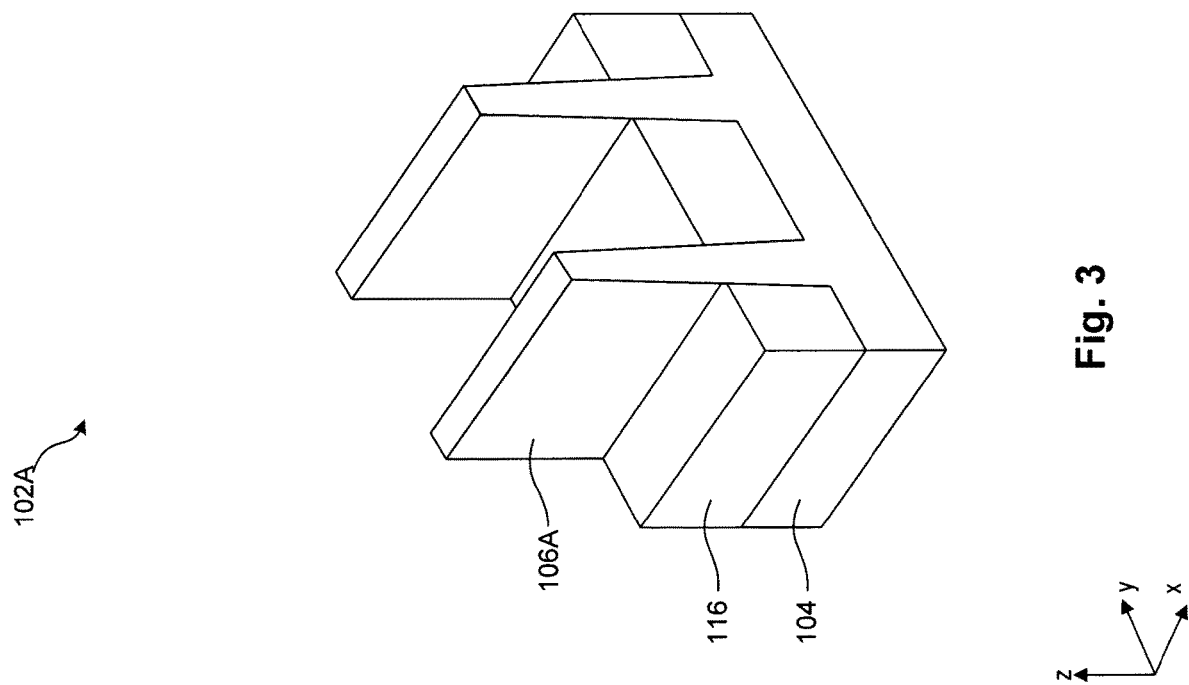

FIG. 2 is a flow diagram of an example method 200 for fabricating FET 102A with cross-section as shown in FIG. 1B, according to some embodiments. For illustrative purposes, the operations illustrated in FIG. 2 will be described with reference to the example fabrication process for fabricating FET 102A as illustrated in FIGS. 3-4 and 5A-12B. FIGS. 3-4 are isometric views and FIGS. 5A-12B are cross-sectional views of FET 102A along lines A-A and C-C of FIG. 1A at various stages of fabrication, according to various embodiments. Operations can be performed in a different order or not performed depending on specific applications. It should be noted that method 200 may not produce complete FET 102A. Accordingly, it is understood that additional processes can be provided before, during, and after method 200, and that some other processes may only be briefly described herein. Elements in FIGS. 3-4 and 5A-12B with the same annotations as elements in FIGS. 1A-1C are described above. Though method 200 describes operations for fabricating FET 102A, similar operations can be performed to fabricate FET 102B at the same time as FET 102A on same substrate 104.

In operation 205, fin structures are formed on a substrate. For example, as shown in FIG. 3, fin structures 106A are formed on substrate 104. The formation of fin structures 106A can include using a lithographic patterning process on substrate 104. Similar operations can be performed at the same time on substrate 104 to form fin structures 106B. After the formation of fin structures 106A, STI regions 116 can be formed, as shown in FIG. 3.

Figure 5B:
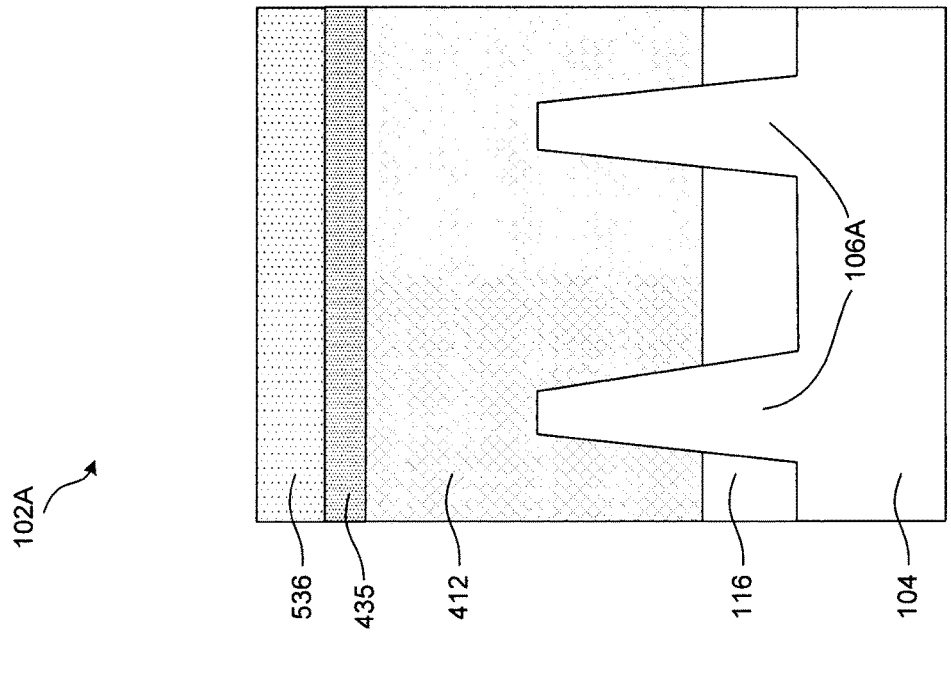
Figure 5A:
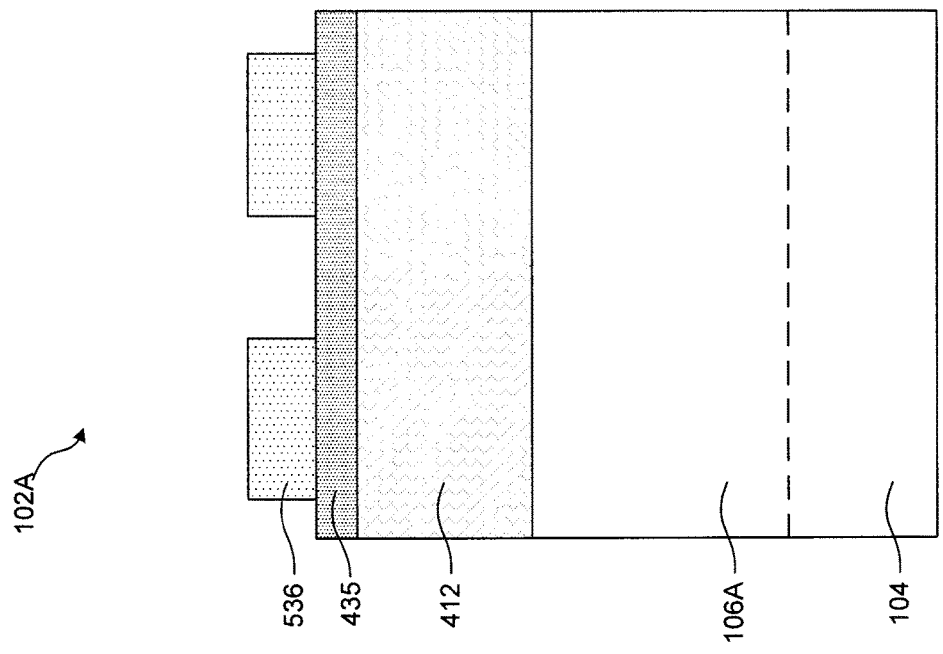
Figure 6B:
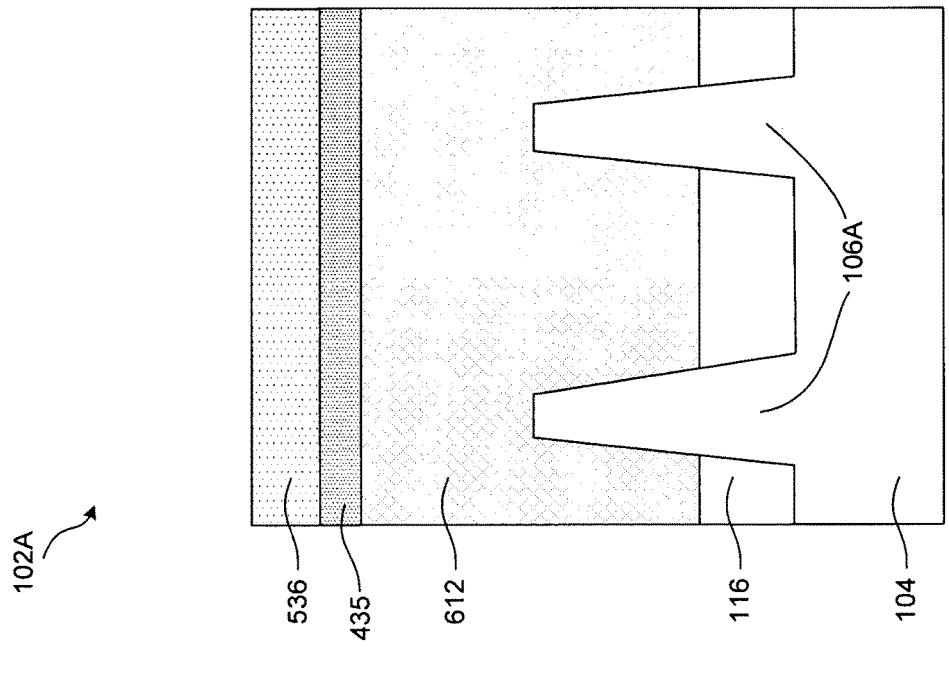
Figure 6B:
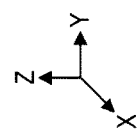
Figure 6A:
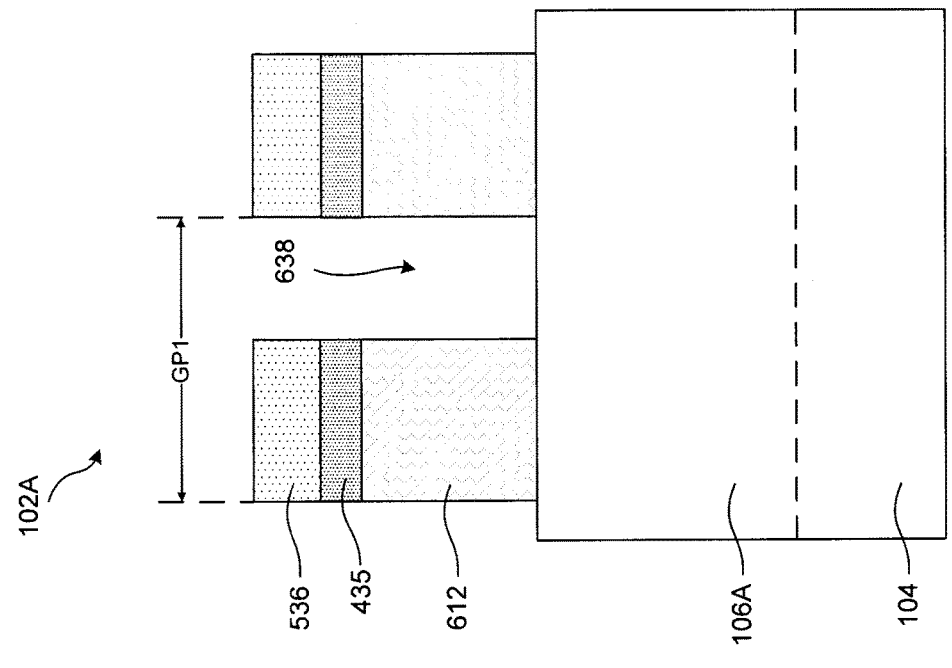
Figure 6A:
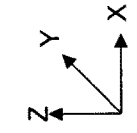

Referring to FIG. 2, in operation 210, polysilicon structures are formed on the fin structures. For example, as described with reference to FIGS. 4 and 5A-6B, polysilicon structures 612 are formed on fin structures 106A. The formation of polysilicon structures 612 can include sequential operations of (i) depositing a polysilicon layer 412 on the structure of FIG. 3, as shown in FIG. 4, (ii) depositing a hard mask 435 on polysilicon layer 412, as shown in FIG. 4, (iii) depositing a masking layer 436 on hard mask 435, as shown in FIG. 4, (iv) forming a patterned masking layer 536, as shown in FIG. 5A, and (v) etching hard mask 435 and polysilicon layer 412 through patterned masking layer 536 to form polysilicon structures 612 with gate pitch GP1, as shown in FIGS. 6A-6B. Though similar operations can be performed at the same time on fin structures 106B to form similar polysilicon structures 612 on fin structures 106B, a different masking pattern is used for the formation of the polysilicon structures on fin structures 106B to achieve gate pitch GP2 of FET 102B.

Figure 7A:
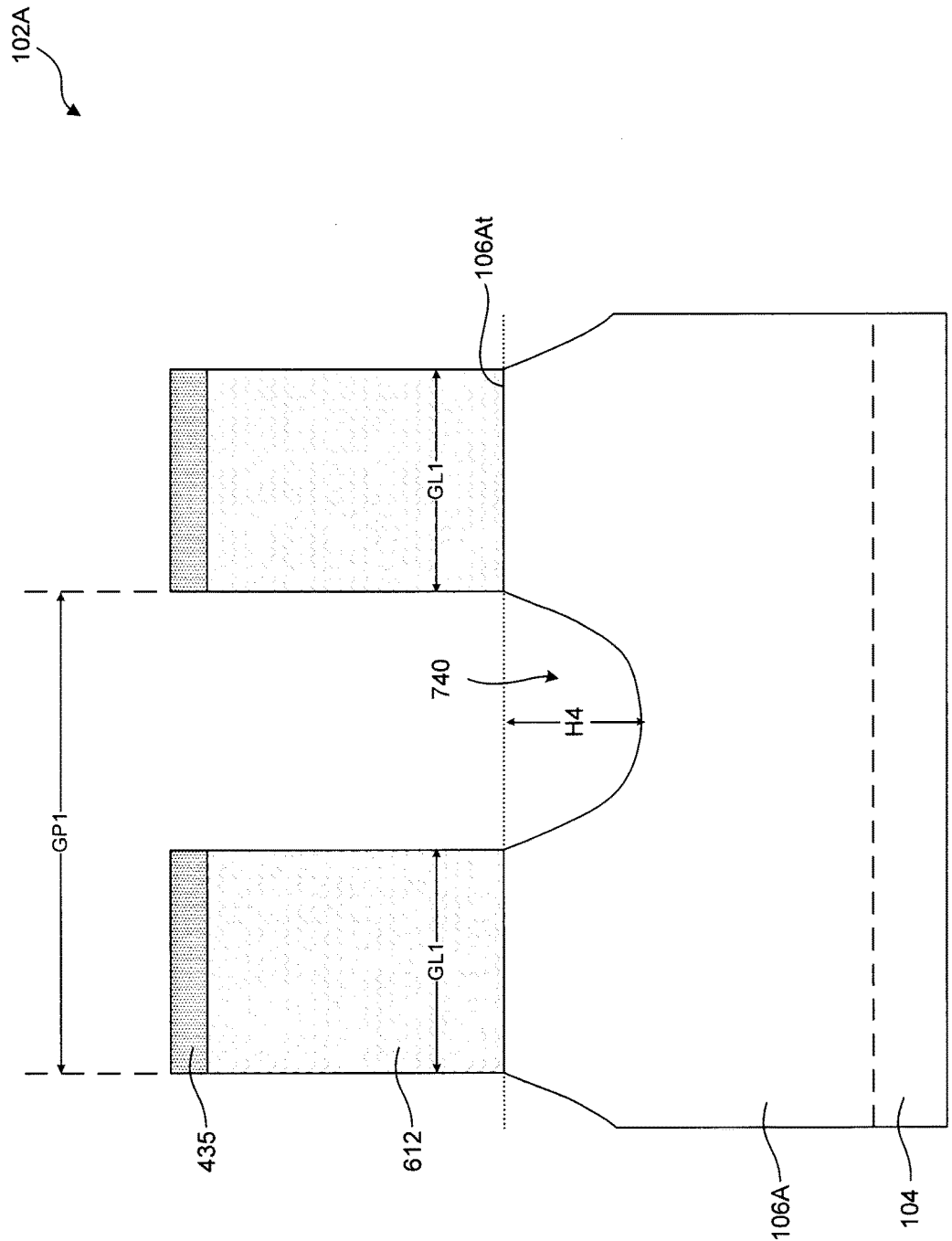
Figure 7B:
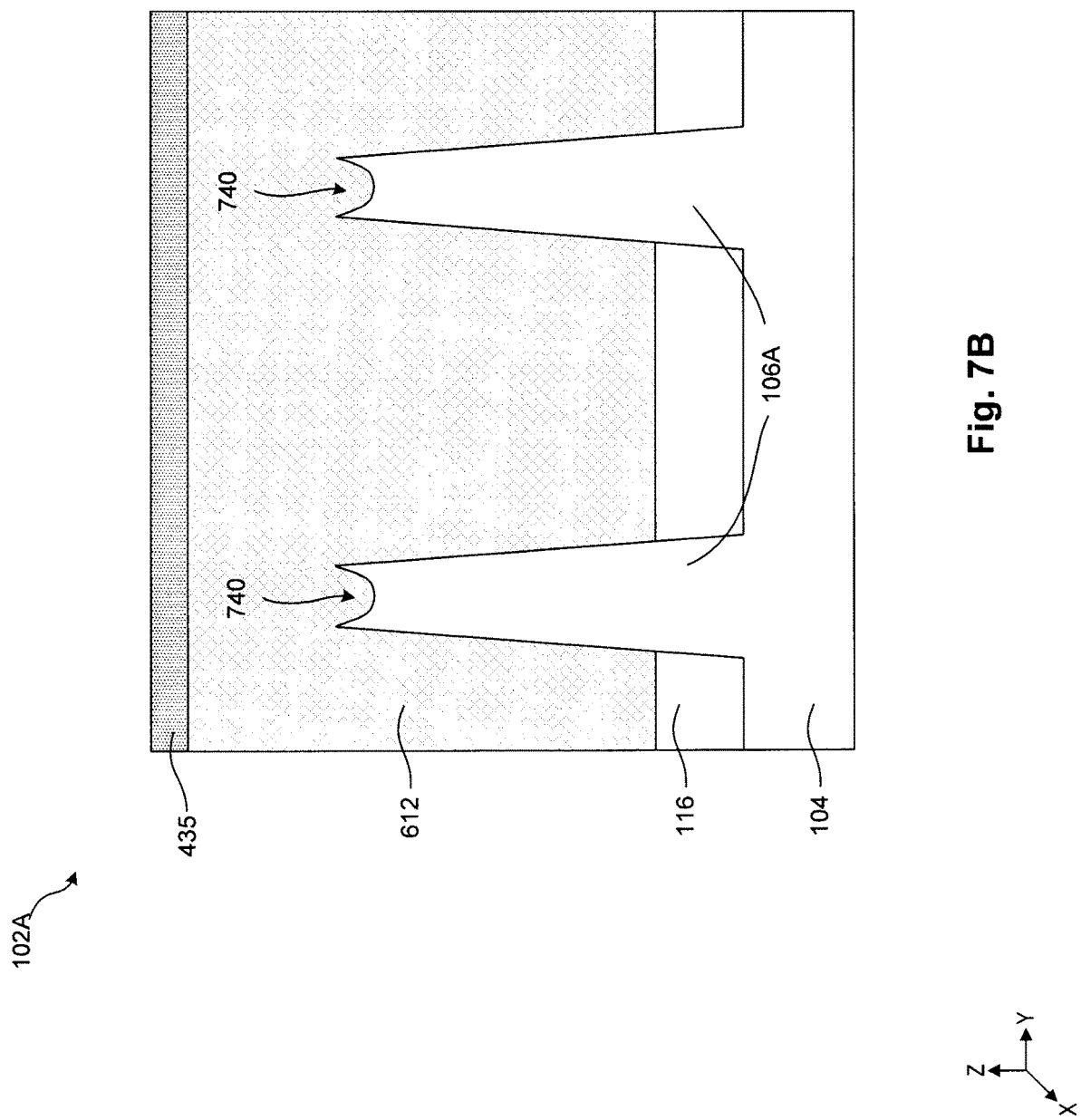
Figure 8A:
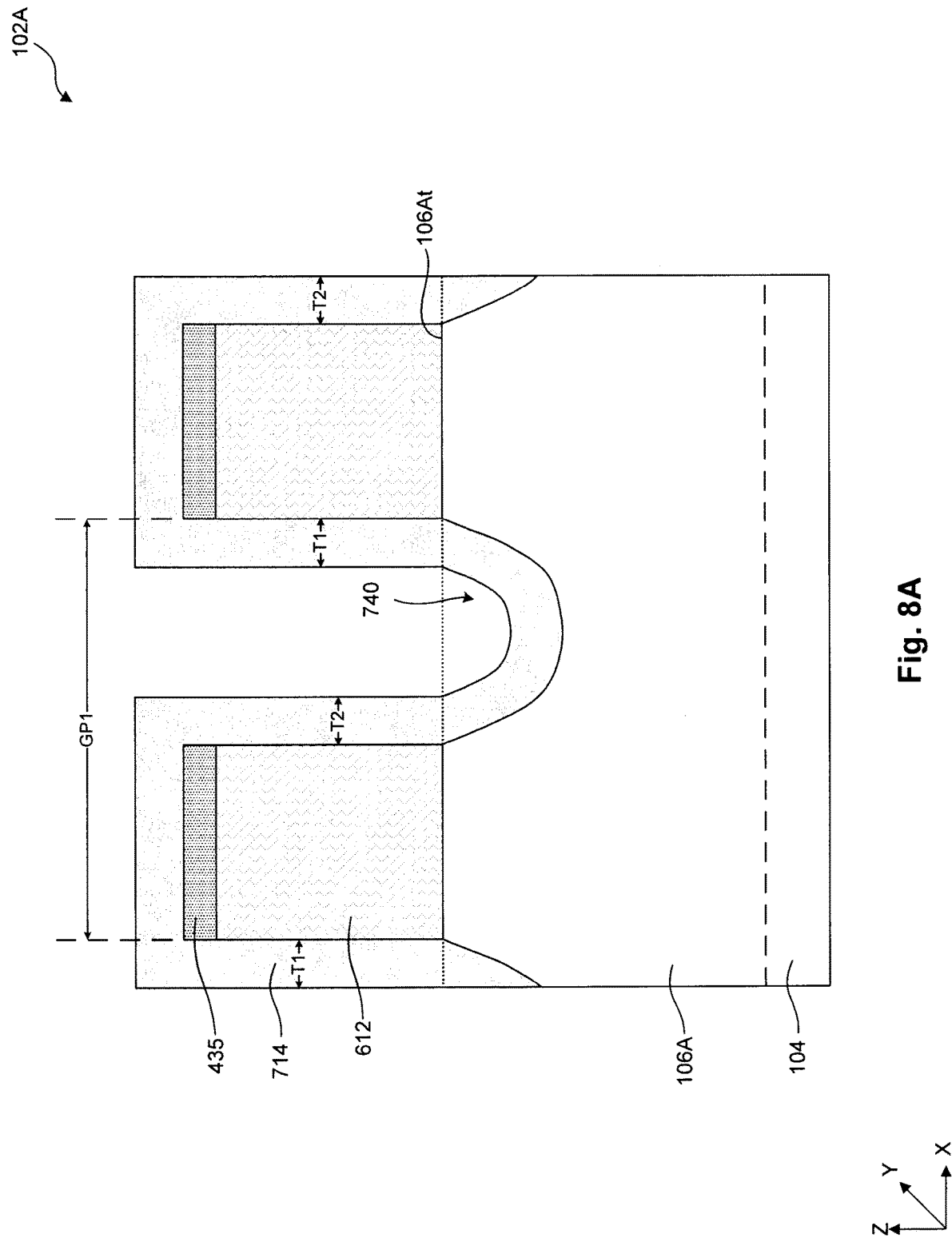
Figure 8B:
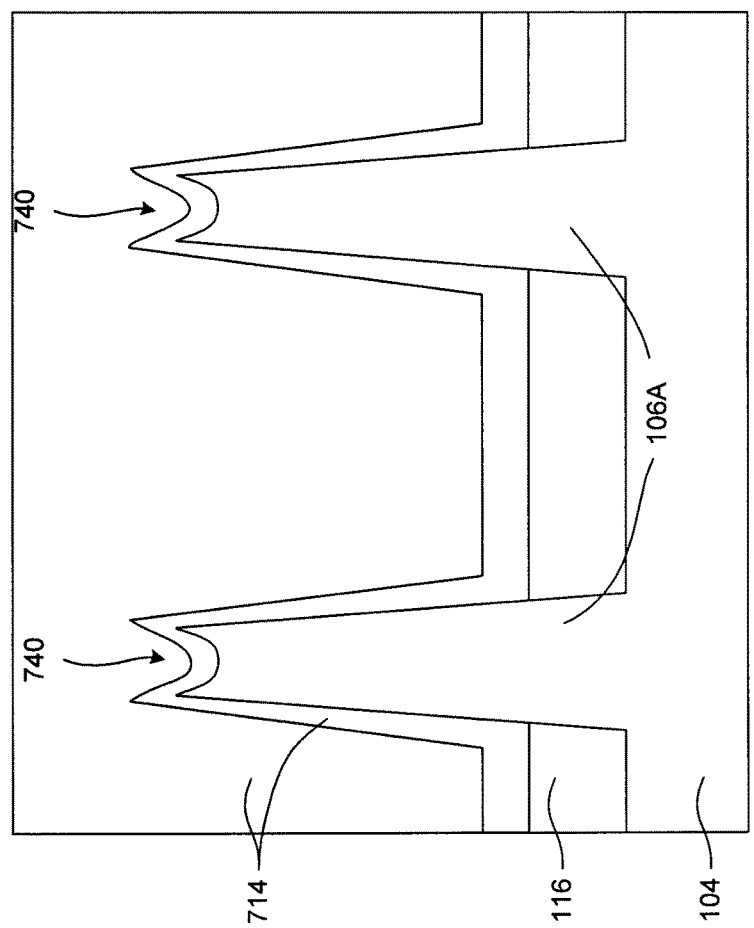
Figure 9A:
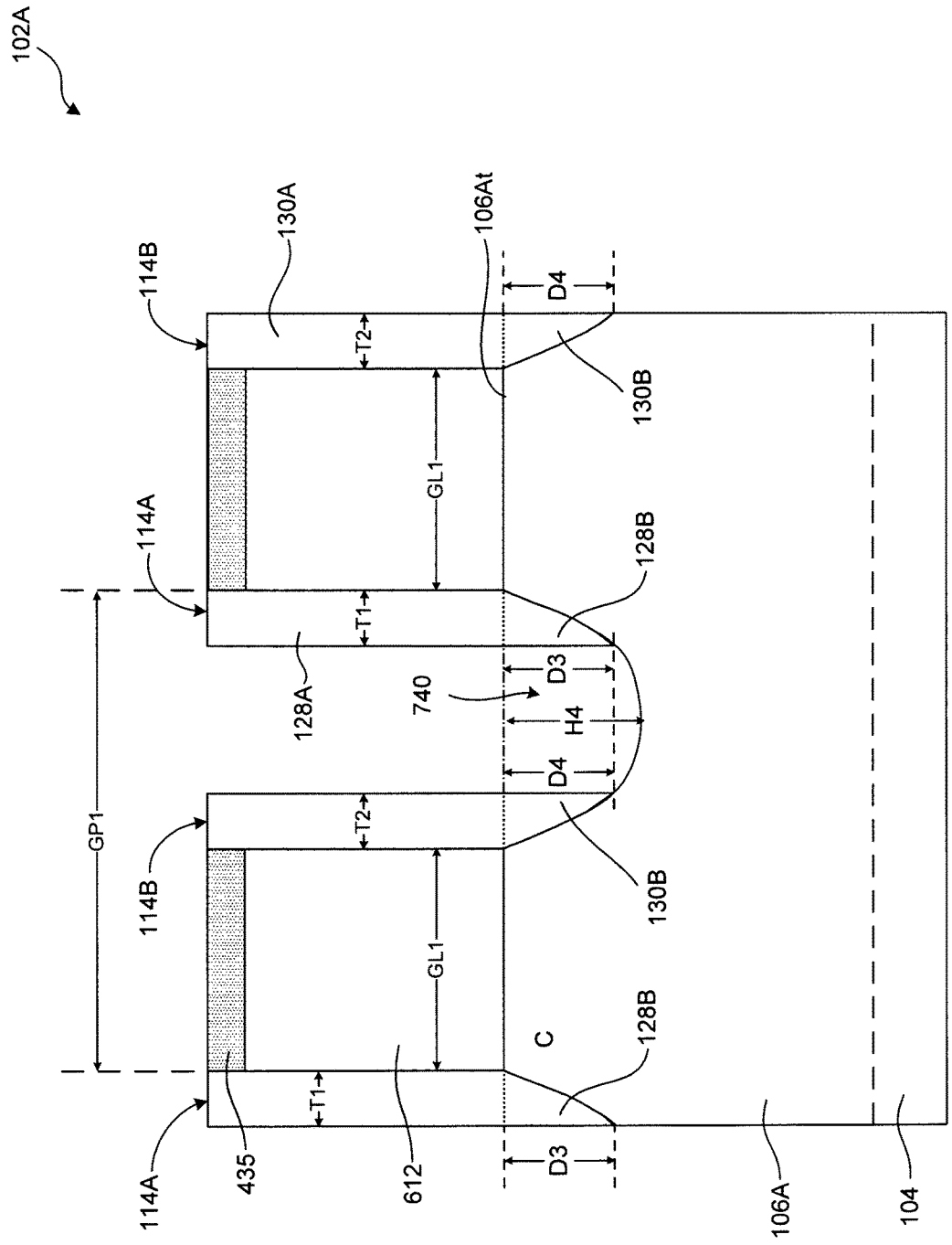
Figure 9B:
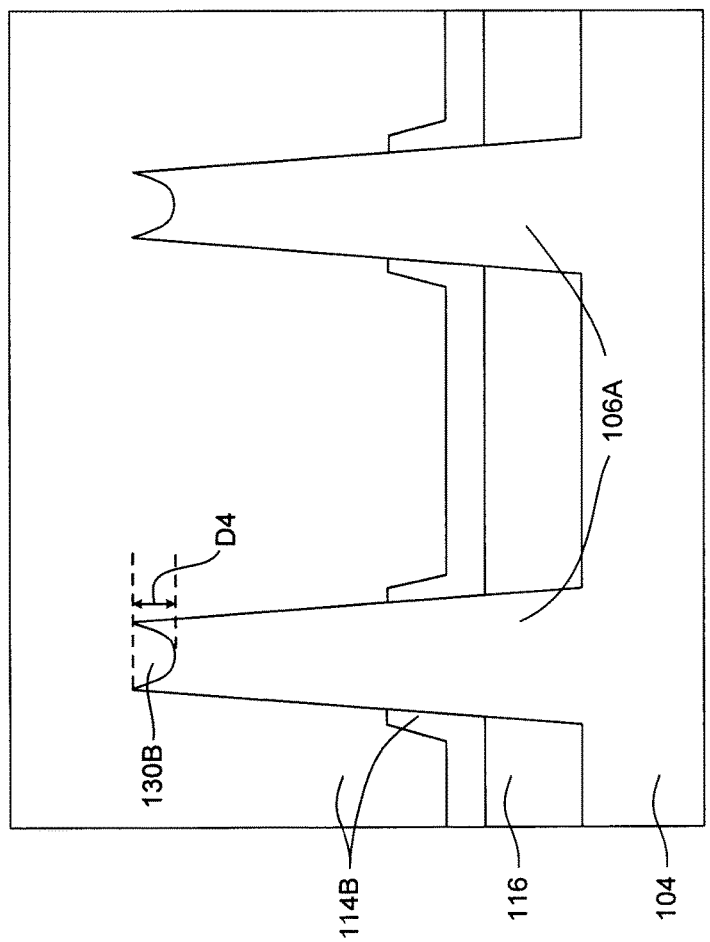

Referring to FIG. 2, in operation 215, gate spacers are formed with first spacer portions along sidewalls of the polysilicon structures and second spacer portions within the fin structures. For example, as described with reference to FIGS. 7A-9B, gate spacers 114A and 114B are formed with first spacer portions 128A and 130A along sidewalls of polysilicon structures 612 and second spacer portions 128B and 130B within fin structures 106A. The formation of gate spacers 114A and 114B can include sequential operations of (i) forming spacer openings 740, as shown in FIGS. 7A-7B, by etching exposed regions of fin structures 106A through openings 638 (shown in FIG. 6A) between polysilicon structures 612, (ii) removing patterned masking layer 536, (iii) depositing a spacer material layer 714 on the structures of FIGS. 7A-7B to form the structures of FIGS. 8A-8B, and (iv) etching spacer material layer 714 to form gate spacers 114A and 114B, as shown in FIGS. 9A-9B.

The etching of fin structures 106A through openings 638 can include using an etching gas, such as sulfur hexafluoride ($SF_6$) and carbon tetrafluoride ($CF_4$) with a gas mixture of chlorine, hydrogen bromide (HBr), and helium at a pressure ranging from about 10 mtorr to about 200 mtorr, and a bias power ranging from about 100 W to about 800 W. In some embodiments, the ratio of etching gas $SF_6$ or $CF_4$ to the gas mixture can range from about 1:10 to about 1:25. In some embodiments, if the etching bias power is 100 W, the etching can be performed at a temperature ranging from about 20° C. to about 60° C. for a duration of about 300 seconds to about 1200 seconds. In some embodiments, if the etching bias power is 800 W, the etching can be performed at a temperature ranging from about 20° C. to about 60° C. for a duration of about 100 seconds to about 500 seconds.

Figure 13:
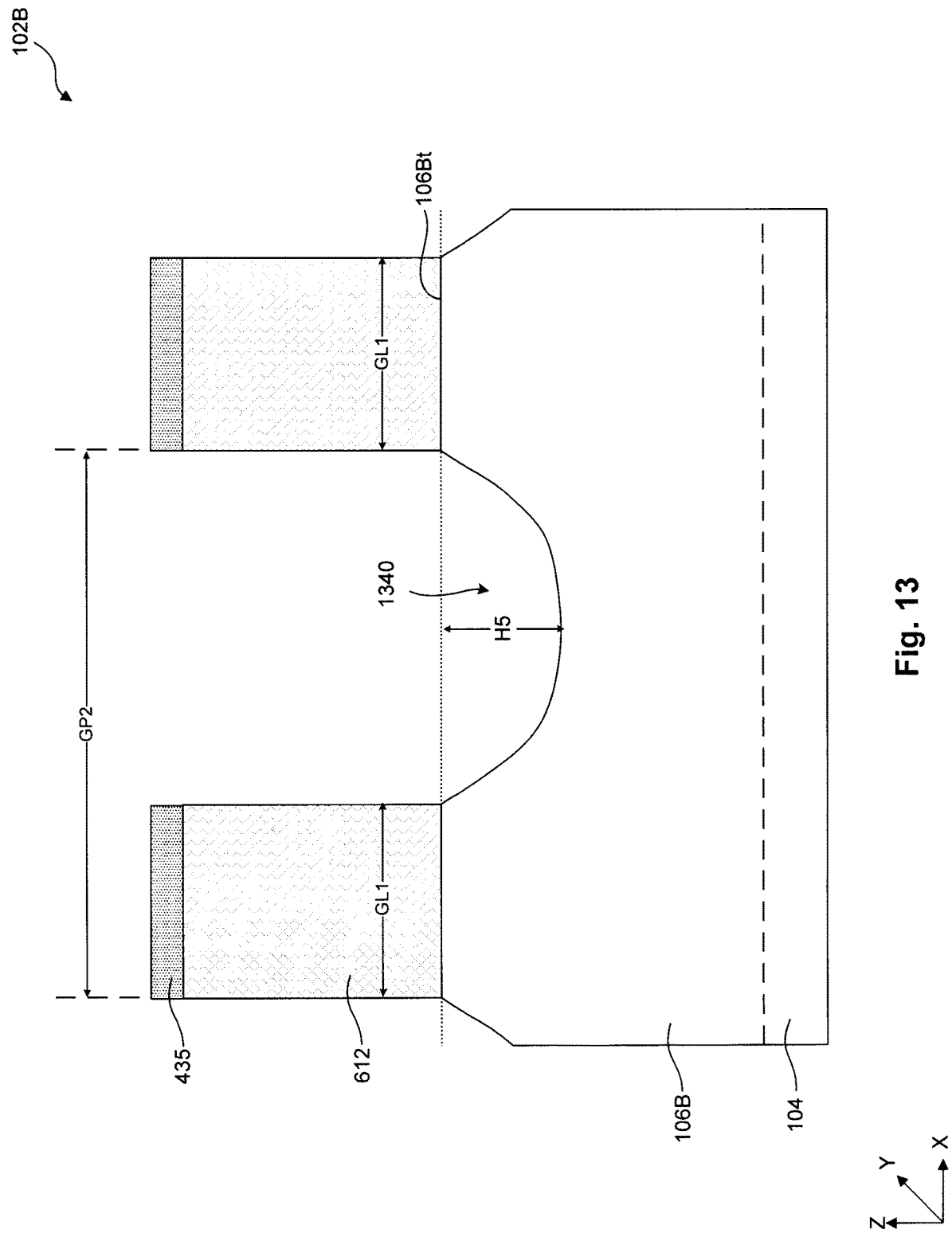
Figure 14:
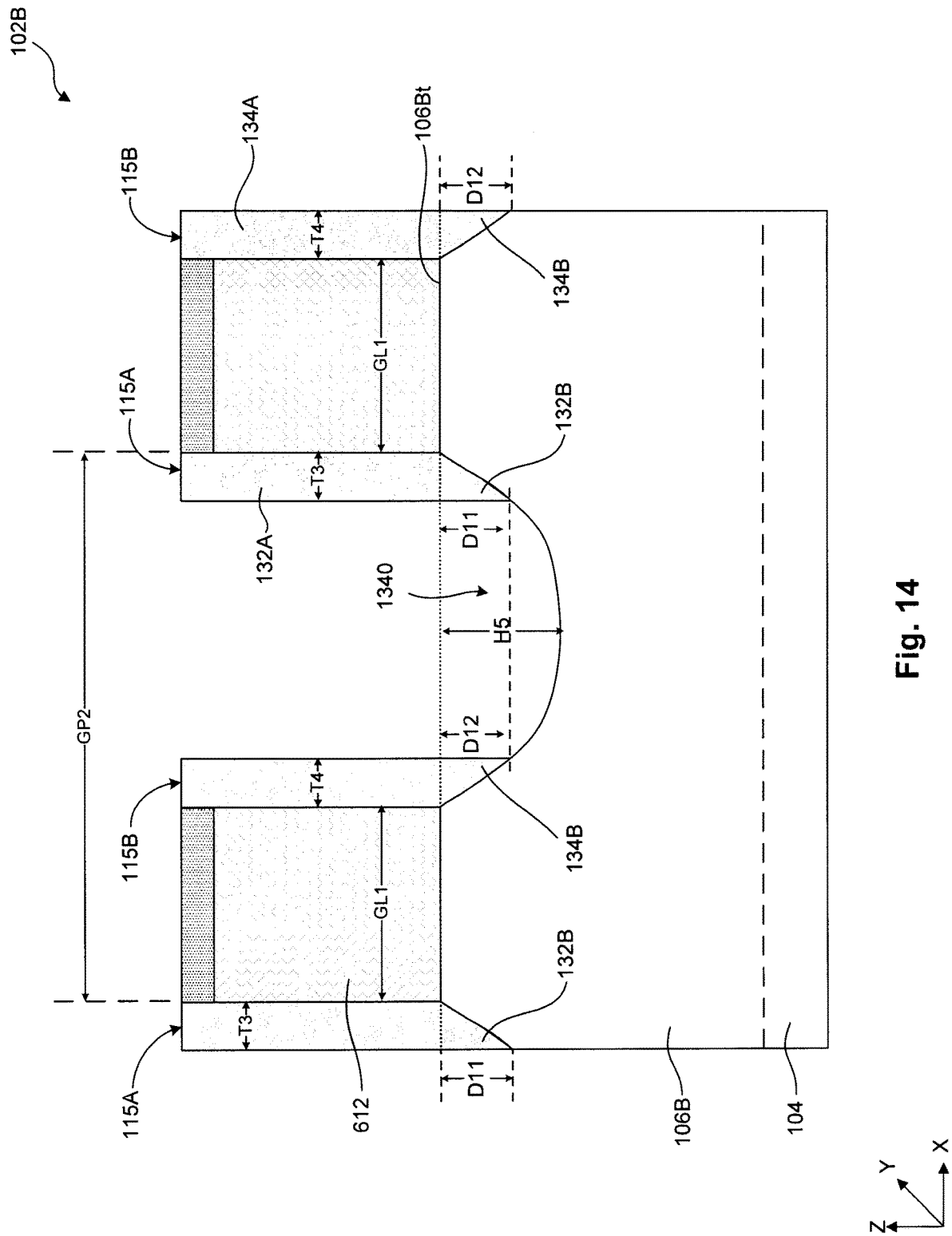

Similar etching operations can be performed simultaneously on exposed regions of fin structures 106B through openings between polysilicon structures 612 of FET 102B to form spacer openings 1340, as shown in FIG. 13. Due to the wider spacing between polysilicon structures 612 of FET 102B than that between polysilicon structures 612 of FET 102A, spacer opening 1340 has a radius of curvature smaller than a radius of curvature of spacer opening 740, and spacer opening 1340 has a maximum height H5 shorter than a maximum height H4 of spacer opening 740. As a result, second spacer portions 132B and 134B are formed with shorter distances D11 and D12 into fin structure 106B, as shown in FIG. 14, compared to distances D3 and D4 of second spacer portions 128B and 130B, as shown in FIG. 9A. Gate spacers 115A and 115B, as shown in FIG. 14, can be formed on the structure of FIG. 13 in operations similar to the sequential operations (ii)-(iv) of forming gate spacers 114A and 114B.

Figure 10A:
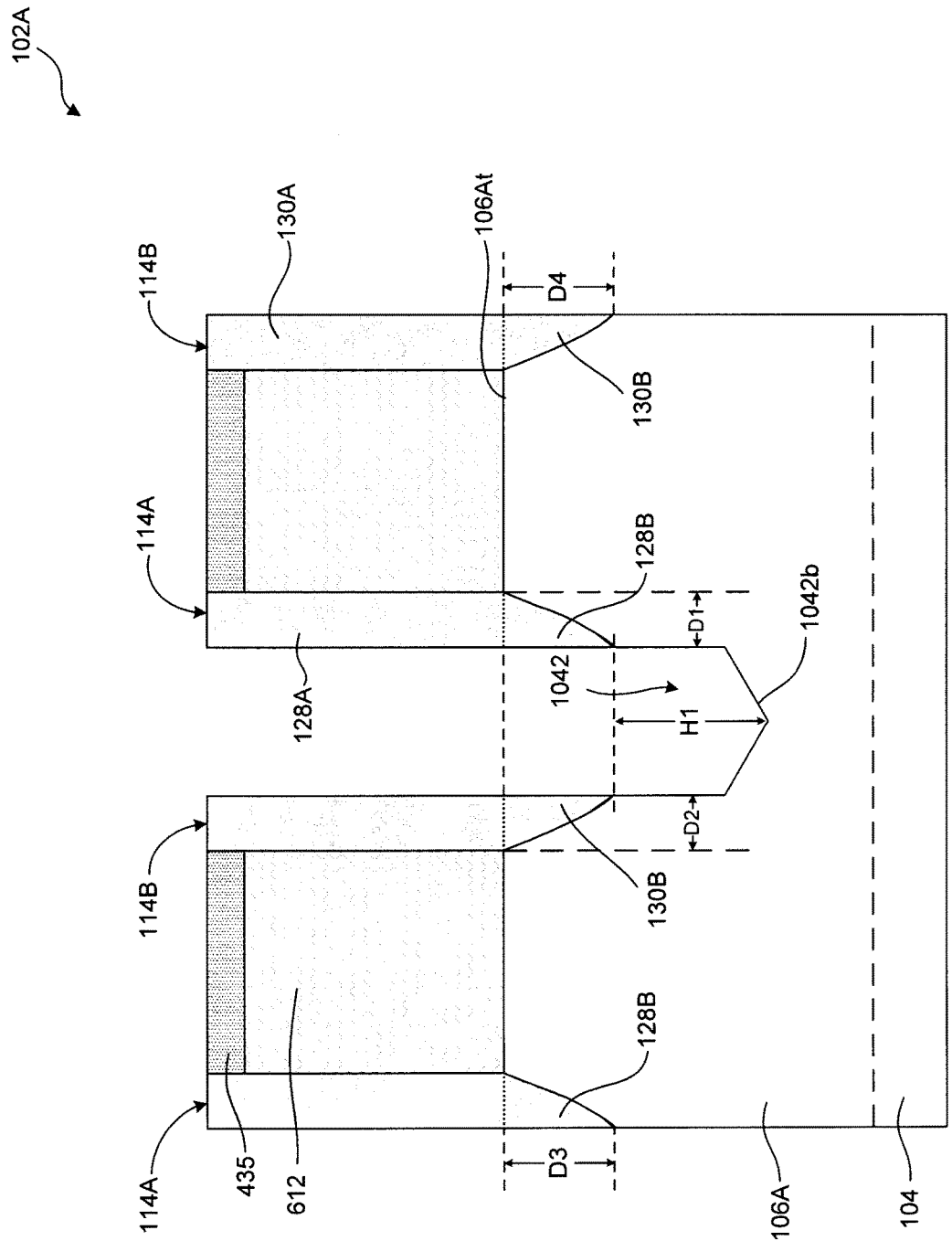
Figure 10B:
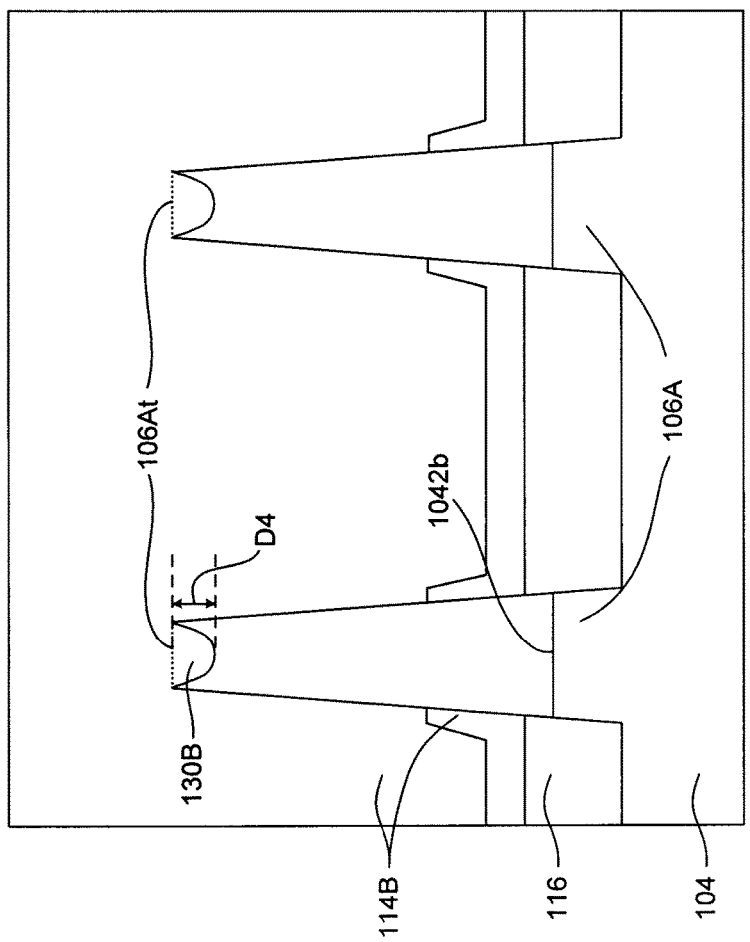
Figure 11A:
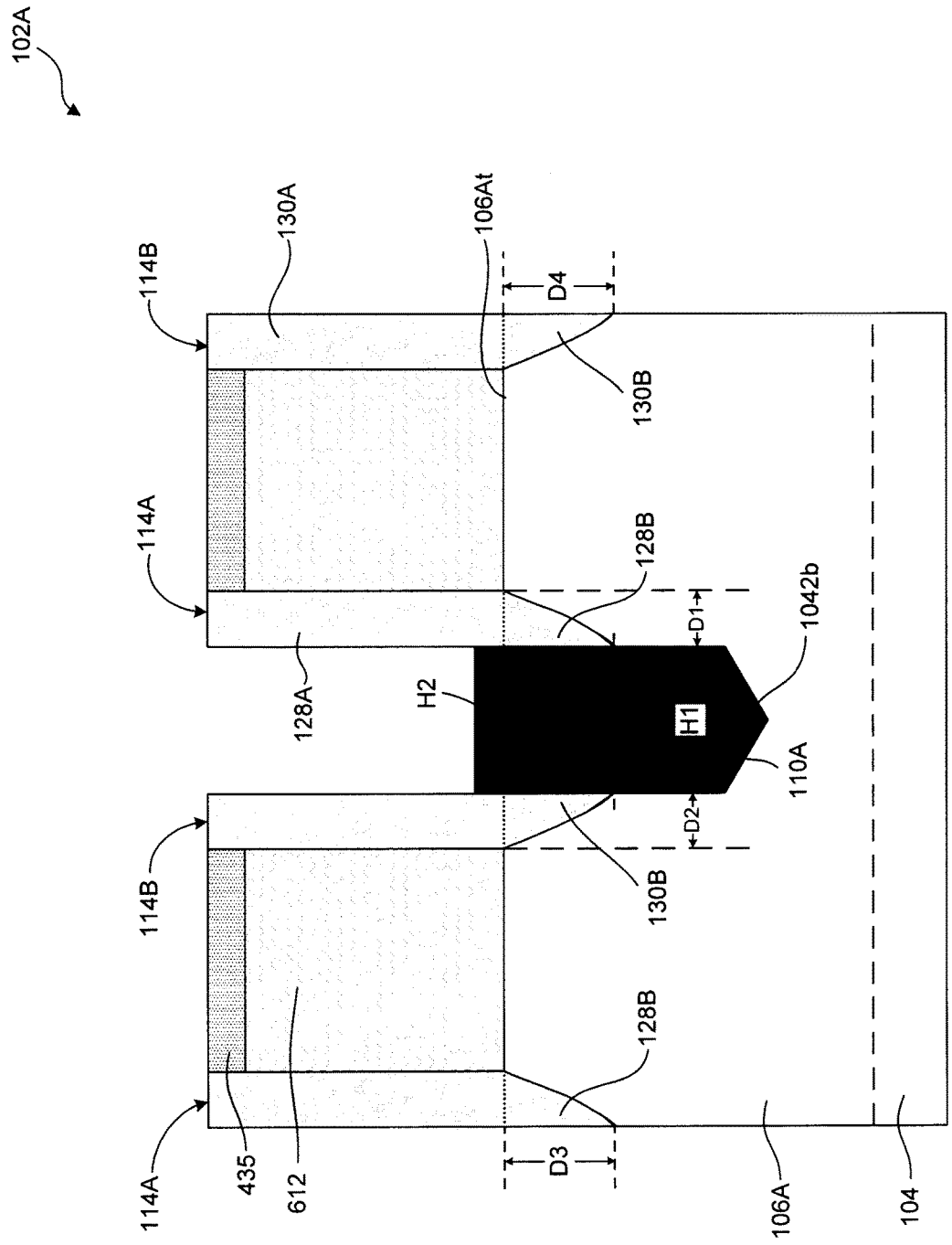
Figure 11B:
Figure 11B:
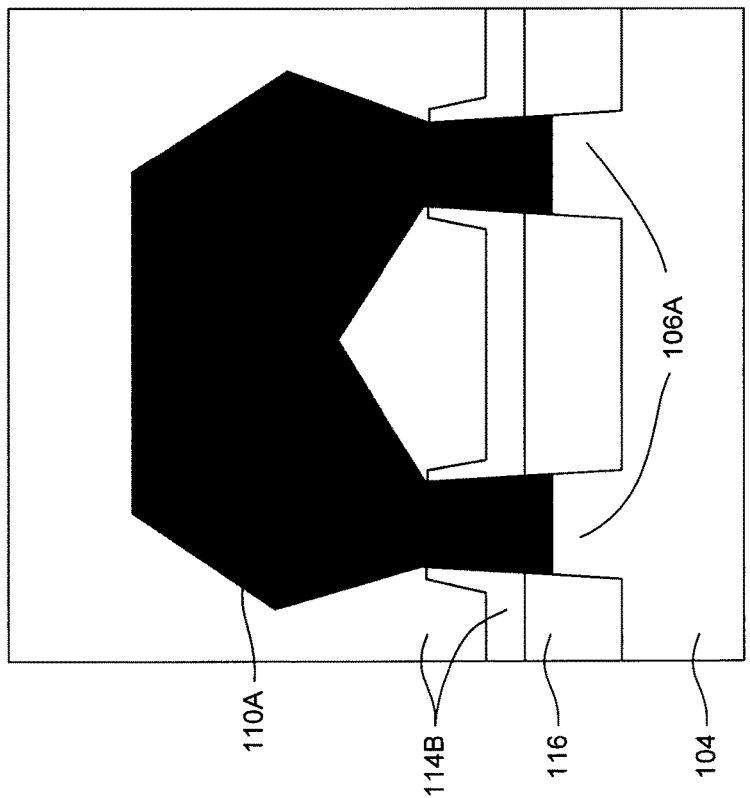
Figure 11B:
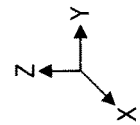
Figure 12A:
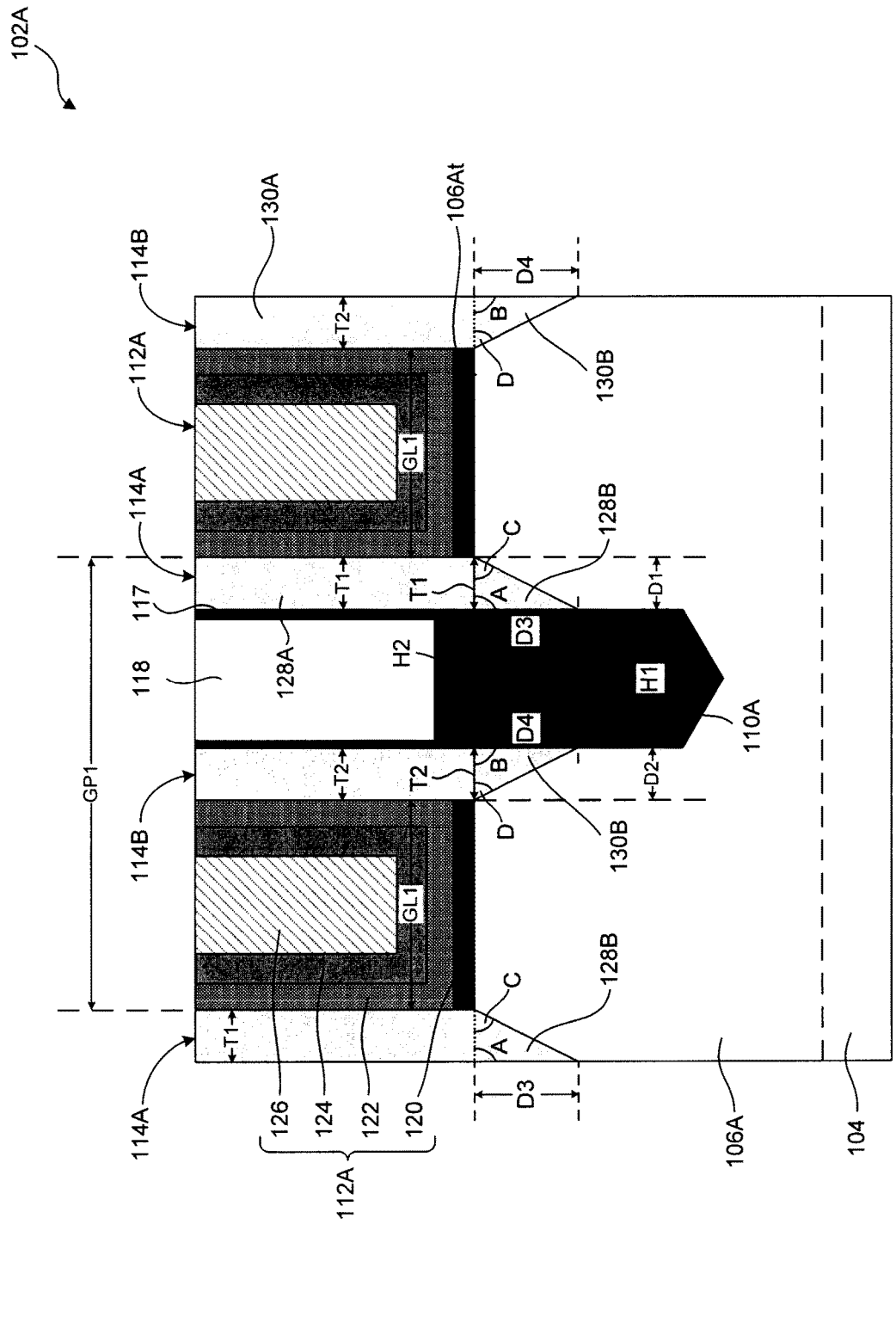
Figure 12B:
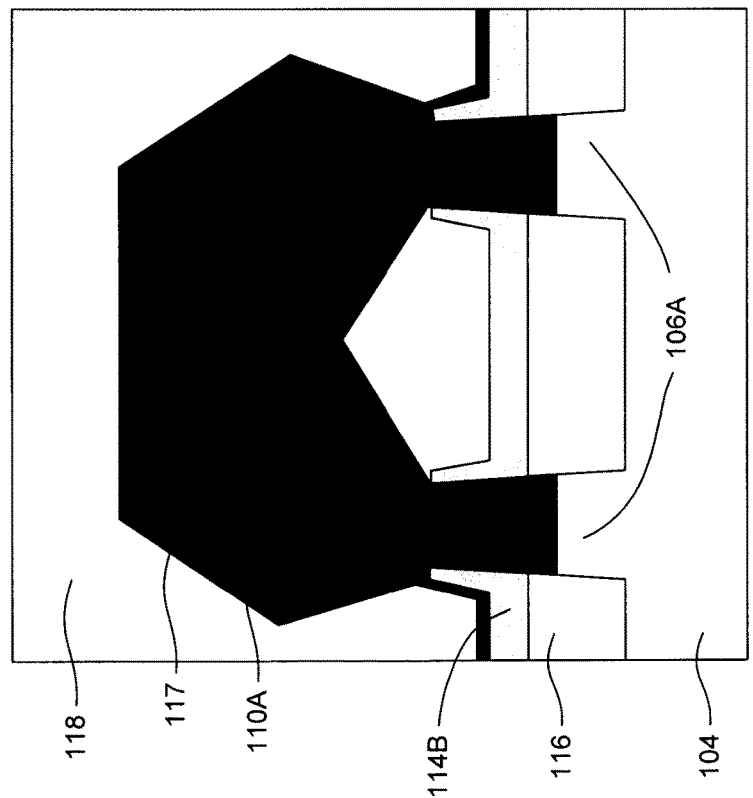

Referring to FIG. 2, in operation 220, epitaxial S/D regions are formed on the fin structures. For example, as described with reference to FIGS. 10A-11B, epitaxial S/D regions 110A are formed in fin structures 106A. The formation of epitaxial S/D regions 110A can include sequential operations of (i) forming S/D opening 1042, as shown in FIG. 10A, and (ii) epitaxially growing a semiconductor material within S/D opening 1042 to form epitaxial S/D regions 110A, as shown in FIGS. 11A-11B. The formation of S/D opening 1042 can include etching fin structures 106A through spacer opening 740 and extending spacer opening 740 by distance H1 below second spacer portions 128A and 130B, as shown in FIG. 10A. The formation of epitaxial S/D regions 110A can be followed by the formation of ESL 117 and ILD layer 118, as shown in FIGS. 12A-12B.

Referring to FIG. 2, in operation 225, polysilicon structures are replaced with gate structures. For example, as shown in FIG. 12A, polysilicon structures 612 and hard mask 435 are replaced with gate structures 112A. The replacement of polysilicon structures 612 and hard mask 435 with gate structures 112A can include sequential operations of (i) etching hard mask 435, (ii) etching polysilicon structures 612 to form gate openings (not shown), (iii) forming IO layers 120 on fin structures 106A within the gate openings, as shown in FIG. 12A, (iv) depositing HK gate dielectric layer 122 on IO layers 120, (v) deposing WFM layer 124 on HK gate dielectric layer 122, (vi) depositing gate metal fill layer 126 on WFM layer 124, and (vii) performing a chemical mechanical polishing (CMP) process to substantially coplanarize top surfaces of HK gate dielectric layer 122, WFM layer 124, and gate metal fill layer 126 with top surface of ILD layer 118, as shown in FIG. 12A.

The present disclosure provides example semiconductor devices (e.g., FETs 102A and 102B) with extended gate spacers (e.g., gate spacers 114A-114B and 115A-115B) in gate structures (e.g., gate structures 112A and 112B) and example methods (e.g., method 200) of forming such semiconductor devices. The extended gate spacers improve sidewall profiles of epitaxial source/drain (S/D) regions (e.g., epitaxial S/D regions 110A and 110B) and prevent the epitaxial S/D regions from extending into the gate structure regions during fabrication to avoid electrical shorting between the epitaxial S/D regions and gate structures.

In some embodiments, the gate structures are disposed on a fin structure (e.g., fin structures 106A and 106B) of the semiconductor device and the epitaxial S/D regions are grown within an etched region of the fin structure. The gate structures are separated from the epitaxial S/D regions by the extended gate spacers disposed along sidewalls of the gate structures. In some embodiments, first spacer portions (e.g., first spacer portions 128A-130A and 132A-134A) of the extended gate spacers are disposed on a fin top surface (e.g., fin top surfaces 106At and 106Bt) of the fin structure and second spacer portions (e.g., second spacer portions 128B-130B and 132B-134B) of the extended gate spacers are disposed within the fin structure. The first spacer portions can have non-tapered structures and the second spacer portions can have tapered structures. The first spacer portions can protect the gate structures during subsequent processing of adjacent structures. The second spacer portions can control the etch profiles of S/D openings (e.g., S/D openings 1042) formed in the fin structure for the growth of the epitaxial S/D regions in the S/D openings. As a result, the second spacer portions control the sidewall profiles of the epitaxial S/D regions grown in the S/D openings and prevent the epitaxial S/D regions from extending into the gate structure regions.

In some embodiments, a semiconductor device includes a substrate, a fin structure with a fin top surface disposed on the substrate, a source/drain (S/D) region disposed on the fin structure, a gate structure disposed on the fin top surface, and a gate spacer with first and second spacer portions disposed between the gate structure and the S/D region. The first spacer portion extends above the fin top surface and is disposed along a sidewall of the gate structure. The second spacer portion extends below the fin top surface and is disposed along a sidewall of the S/D region.

In some embodiments, a semiconductor device includes a substrate, a fin structure with a fin top surface disposed on the substrate, a source/drain (S/D) region disposed within the fin structure, a gate structure disposed on the fin top surface, and a gate spacer with first and second spacer portions disposed between the gate structure and the S/D region. The first spacer portion is a non-tapered structure and extends above the fin top surface. The second spacer portion is a tapered structure and is disposed within the fin structure.

In some embodiments, a method includes forming a fin structure with a fin top surface on a substrate, forming first and second polysilicon structures on the fin top surface, forming a spacer opening within the fin structure and between the first and second polysilicon structures, forming a gate spacer, forming a S/D region between the first and second polysilicon structures, and replacing the first and second polysilicon structure with first and second gate structures. The forming the gate spacer includes forming a first spacer portion of the gate spacer along a sidewall of the first polysilicon structure, and forming a second spacer portion of the gate spacer within the spacer opening.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure with a fin top surface on a substrate;
    forming first and second polysilicon structures on the fin top surface;
    forming a spacer opening in the fin structure and between the first and second polysilicon structures;
    forming a gate spacer, wherein forming the gate spacer comprises:
        forming a first spacer portion of the gate spacer along a sidewall of the first polysilicon structure, and
        forming a second spacer portion of the gate spacer, in the spacer opening, comprising forming the second spacer portion with a triangular-shaped structure comprising a first sloped spacer sidewall facing the fin structure and a second sloped spacer sidewall facing the spacer opening;
    forming a source/drain (S/D) region, between the first and second polysilicon structures, comprising forming the S/D region with a sloped sidewall adjacent to the second sloped spacer sidewall; and
    replacing the first and second polysilicon structures with first and second gate structures.

2. The method of claim 1, wherein forming the spacer opening comprises etching an exposed region of the fin structure between the first and second polysilicon structures.

3. The method of claim 1, wherein forming the spacer opening comprises etching the fin structure with an etching gas of sulfur hexafluoride or carbon tetrafluoride in a gas mixture comprising chlorine, hydrogen bromide, and helium.

4. The method of claim 3, wherein a ratio of the etching gas to the gas mixture is about 1:10 to about 1:25.

5. The method of claim 1, wherein forming the gate spacer comprises depositing a spacer layer on the first and second polysilicon structures and in the spacer opening.

6. The method of claim 1, wherein forming the S/D region comprises:
    etching the fin structure through the spacer opening to form a S/D opening with substantially vertical sidewalls; and
    epitaxially growing a semiconductor layer in the S/D opening.

7. The method of claim 1, wherein forming the S/D region comprises forming a S/D opening extending below the second spacer portion; and
    wherein entire sidewalls of the S/D opening are substantially vertical.

8. The method of claim 1, wherein forming the S/D region comprises forming the S/D region with a S/D portion extending below the second spacer portion; and
    wherein entire sidewalls of the S/D portion are substantially vertical.

9. The method of claim 1, wherein forming the second spacer portion comprises forming the second spacer portion with the first sloped spacer sidewall in contact with a fin sidewall of the fin structure; and
    wherein the first sloped spacer sidewall forms an angle of about 30 degrees to about 60 degrees with the fin top surface.

10. A method, comprising:
    forming first and second fin structures on a substrate;
    forming first and second polysilicon structures on the first and second fin structures, respectively;

forming a first gate spacer comprising a first spacer portion along a sidewall of the first polysilicon structure and a second spacer portion along a fin sidewall of the first fin structure;

forming, at a same time as forming the first gate spacer, a second gate spacer comprising a third spacer portion along a sidewall of the second polysilicon structure and a fourth spacer portion along a fin sidewall of the second fin structure, wherein a height of the second spacer portion is greater than a height of the fourth spacer portion;

forming a first source/drain (S/D) region adjacent to the first gate spacer;

forming a second S/D region adjacent to the second gate spacer; and replacing the first and second polysilicon structures with first and second gate structures.

11. The method of claim 10, wherein forming the first gate spacer comprises forming a first spacer opening with a first radius of curvature; and wherein forming the second gate spacer comprises forming a second spacer opening with a second radius of curvature smaller than the first radius of curvature.

12. The method of claim 10, wherein forming the first gate spacer comprises forming the second spacer portion with a sloped sidewall in contact with the fin sidewall of the first fin structure.

13. The method of claim 10, wherein forming the first gate spacer comprises forming the second spacer portion with a sidewall forming an angle of about 30 degrees to about 60 degrees with a top surface of the first fin structure.

14. The method of claim 10, wherein forming the first S/D region comprises forming a first S/D opening extending below the second spacer portion; and wherein entire sidewalls of the first S/D opening are substantially vertical.

15. The method of claim 10, wherein forming the first S/D region comprises forming the first S/D region with a S/D portion extending below the second spacer portion; and wherein entire sidewalls of the S/D portion are substantially vertical.

16. A method, comprising:

forming a fin structure on a substrate;

forming a spacer opening, in the fin structure, comprising etching the fin structure with a fluorine-based etching gas in a gas mixture comprising chlorine, hydrogen bromide, and helium, wherein a ratio of the fluorine-based etching gas to the gas mixture is about 1:10 to about 1:25;

forming a spacer along a sidewall of the fin structure and in the spacer opening; and forming a source/drain (S/D) region comprising a first S/D portion along a sidewall of the spacer and a second S/D portion along a sidewall of the fin structure, wherein entire sidewalls of the second S/D portion are substantially vertical.

17. The method of claim 16, wherein forming the spacer comprises forming the spacer with a sloped sidewall in contact with a sidewall of the fin structure.

18. The method of claim 16, wherein forming the spacer opening comprises etching the fin structure with sulfur hexafluoride or carbon tetrafluoride in the gas mixture.

19. The method of claim 16, wherein forming the spacer comprises forming the spacer with a triangular-shaped structure comprising a first sloped spacer sidewall facing the fin structure and a second sloped spacer sidewall facing the spacer opening.

20. The method of claim 19, wherein forming the spacer comprises forming the spacer with the first sloped spacer sidewall in contact with a fin sidewall of the fin structure.

* * * * *